United States Patent
Matsuo et al.

(10) Patent No.: US 8,755,468 B2
(45) Date of Patent: Jun. 17, 2014

(54) PULSE-SYNC DEMODULATOR

(75) Inventors: Michiaki Matsuo, San Jose, CA (US);
Hideki Aoyagi, Miyagi (JP); Hitoshi Asano, Miyagi (JP); Kazuya Toki, Miyagi (JP)

(73) Assignee: Panasonic Corporation, Osaka (JP)

( * ) Notice: Subject to any disclaimer, the term of this patent is extended or adjusted under 35 U.S.C. 154(b) by 782 days.

(21) Appl. No.: 12/374,737

(22) PCT Filed: Jul. 27, 2007

(86) PCT No.: PCT/JP2007/064811
§ 371 (c)(1),
(2), (4) Date: Jan. 22, 2009

(87) PCT Pub. No.: WO2008/013284
PCT Pub. Date: Jan. 31, 2008

(65) Prior Publication Data
US 2010/0246660 A1    Sep. 30, 2010

(30) Foreign Application Priority Data

Jul. 27, 2006  (JP) .................................. 2006-205051
Jul. 26, 2007  (JP) .................................. 2007-194449

(51) Int. Cl.
*H04L 27/06* (2006.01)

(52) U.S. Cl.
USPC ......................................... 375/340; 375/326

(58) Field of Classification Search
USPC .................. 375/340, 350, 339, 324, 327, 326
See application file for complete search history.

(56) References Cited

U.S. PATENT DOCUMENTS

| 4,736,189 | A | * | 4/1988 | Katsumata et al. ........... 341/120 |
| 4,763,105 | A | * | 8/1988 | Jenq .............................. 341/120 |
| 4,962,380 | A | * | 10/1990 | Meadows ...................... 341/120 |
| 5,745,468 | A | * | 4/1998 | Nakano ....................... 369/59.19 |
| 5,808,464 | A | * | 9/1998 | Natori et al. ................ 324/121 R |
| 5,914,986 | A | * | 6/1999 | Ohta et al. .................... 375/328 |
| 5,920,220 | A | * | 7/1999 | Takao et al. .................. 327/233 |
| 5,929,220 | A | * | 7/1999 | Tong et al. ................... 536/23.1 |
| 6,160,578 | A | * | 12/2000 | Carroll et al. ............... 348/222.1 |

(Continued)

FOREIGN PATENT DOCUMENTS

| JP | 2004-159196 A | 6/2004 |
| JP | 2005-518111 A | 6/2005 |

OTHER PUBLICATIONS

International Search Report for PCT/JP2007/064811.

*Primary Examiner* — Emmanuel Bayard
(74) *Attorney, Agent, or Firm* — Pearne & Gordon LLP

(57) ABSTRACT

A received pulse signal based on an on-off keying modulation scheme is alternately sampled by AD conversion sections operated by a clock signal whose frequency is one-half of a transmission rate. In the synchronization, amounts of delay in sampling timing adjustment sections are made different from each other, whereby phases of two different points in a symbol pulse are sampled. An amount of delay in a variable delay section is adjusted in accordance with a result of comparison of the sampled values, thereby achieving synchronization. At the time of demodulation, the amount of delay in the variable delay section is held, and the amounts of delay in the sampling timing adjustment sections are switched to the same value, and the symbol pulse is alternately sampled. The sampled values are subjected to threshold value determination, and the determination result is subjected to parallel-to-serial conversion, whereby a demodulation output is acquired.

12 Claims, 20 Drawing Sheets

(56) References Cited

U.S. PATENT DOCUMENTS

| | | | |
|---|---|---|---|
| 6,414,612 B1* | 7/2002 | Quesenberry | 341/120 |
| 6,516,038 B1* | 2/2003 | Ohta et al. | 375/328 |
| 6,556,156 B1* | 4/2003 | Hungerbuehler | 341/120 |
| 6,600,795 B1* | 7/2003 | Ohta et al. | 375/343 |
| 6,604,204 B1* | 8/2003 | Ozdemir et al. | 713/400 |
| 7,126,511 B2* | 10/2006 | Draxelmayr et al. | 341/136 |
| 7,198,197 B2* | 4/2007 | Best | 235/492 |
| 7,227,479 B1* | 6/2007 | Chen et al. | 341/118 |
| 7,233,270 B2* | 6/2007 | Lin | 341/118 |
| 7,697,651 B2* | 4/2010 | Abhayagunawardhana et al. | 375/373 |
| 2002/0105339 A1* | 8/2002 | Nagaraj | 324/601 |
| 2002/0176344 A1* | 11/2002 | Furuta et al. | 369/59.22 |
| 2002/0181360 A1* | 12/2002 | Hamada et al. | 369/47.28 |
| 2003/0071925 A1* | 4/2003 | Kanno et al. | 348/726 |
| 2003/0081667 A1* | 5/2003 | Camnitz et al. | 375/226 |
| 2003/0090403 A1* | 5/2003 | Nanba et al. | 341/155 |
| 2003/0117925 A1* | 6/2003 | Tonami | 369/59.22 |
| 2003/0200518 A1* | 10/2003 | Saeki | 716/6 |
| 2004/0066873 A1* | 4/2004 | Cho et al. | 375/376 |
| 2004/0201728 A1* | 10/2004 | Tamaru | 348/223.1 |
| 2005/0122885 A1* | 6/2005 | Kanaoka | 369/124.05 |
| 2006/0153041 A1* | 7/2006 | Miyashita et al. | 369/59.22 |
| 2006/0170581 A1* | 8/2006 | Lin | 341/155 |
| 2008/0030387 A1* | 2/2008 | Sheng et al. | 341/120 |
| 2008/0111908 A1* | 5/2008 | Oda et al. | 348/311 |

* cited by examiner

IN THE CASE OF n=3

FIG. 14
(CONDITIONS FOR SYNCHRONIZATION)
IN THE CASE OF n=4
VALUE SAMPLED BY CLOCK SIGNAL 2001  = VALUE SAMPLED BY CLOCK SIGNAL 2004
AND
VALUE SAMPLED BY CLOCK SIGNAL 2002 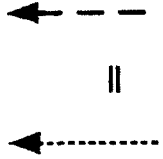 = VALUE SAMPLED BY CLOCK SIGNAL 2003
(MANNER OF SAMPLING PERFORMED AT THE TIME OF SYNCHRONIZATION)
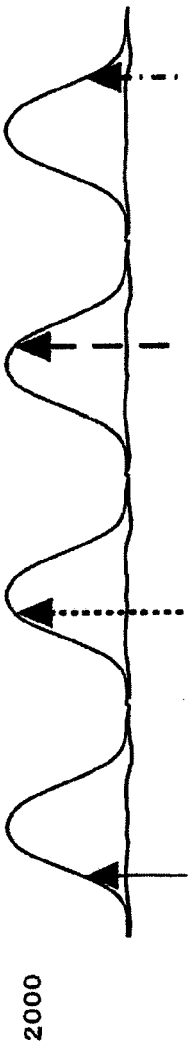
2000

PULSE-SYNC DEMODULATOR

TECHNICAL FIELD

The present invention relates to a pulse-sync demodulator that receives a pulse signal wirelessly transmitted by means of a pulse modulation scheme, such as on-off keying, and more particularly to a pulse-sync demodulator that performs synchronization and demodulation of a received signal by means of low power consumption.

BACKGROUND ART

There has recently been a demand for application that interconnects devices, such as a portable cellular phone terminal, an audiovisual device, a personal computer, and peripheral devices thereof, and that exchange data, such as multimedia information. Conceivable uses are; for instance, managing music data recorded by audio equipment through use of a personal computer and transferring video data recorded by visual equipment to a portable cellular phone terminal and viewing the thus-transferred video data outside.

Conceivable means for implementing such a demand is to connect the devices by means of a cable, to thus constitute a network. However, establishment of a wired network raises problems in terms of user's convenience, such as troublesome wire-connection work and restrictions on the layout of devices.

For these reasons, a wireless network has gained attention as means for enhancing convenience to a much greater extent. Practical use of techniques pertaining to a wireless LAN typified by IEEE802.11b and a wireless PAN (personal area network) typified by Bluetooth is proceeding.

Against such a backdrop, a communications scheme called an ultra-wide band (Ultra Wide Band hereinafter abbreviated as "UWB") for transmitting a pulse-like modulation signal by use of a wide frequency band has received attention as a technique for inexpensively providing faster data communication.

The UWB is for enabling utilization of an extremely-wide frequency band and gaining a large capacity communications line by adoption of low transmission power of an order of magnitude which does not interfere with an existing radio system and yields an advantage of the ability to attain an extremely-high data transmission rate at nominal power. Some of wireless transmission schemes using the UWB use a technique for converting a pulse-like signal having broadband spectrum components into a radio frequency and transmitting the signal at the frequency.

When the wirelessly-transmitted pulse signal is received, processing in synchronism with the received pulse signal is required for reasons of demodulation. A receiver that enables performance of processing for demodulating the received pulse signal having a high transmission rate while assuring synchronization is a configuration; for instance, such as that described in Patent Document 1.

FIG. 15 shows a configuration for synchronization with a received pulse signal in the related art. Moreover, FIG. 16 illustrates a processing system 210 for demodulation purpose in addition to showing a sync processing system 215 shown in FIG. 15.

In FIG. 16, the received pulse signal input from an antenna 100 is mixed with a replica pulse internally generated by a demodulation correlation mixer 310 and sync correlation mixers 405 and 410 at different timings, whereby correlation values are determined. The correlation values are converted into digital values by means of the AD converters 220 and 225 and are subjected to processing for demodulation and sync control in a controller 230.

FIG. 17A shows a timing relationship between a received pulse signal and an internally-generated pulse that is to become a replica, and FIG. 17B shows a relationship between the two pulses in terms of a phase difference and a correlation output. The phase difference and the correlation output between the received pulse and the internally-generated pulse become symmetrical about a phase difference of zero and become maximum at the phase difference of zero.

FIGS. 18A to 18C show the phase difference and the correlation output obtained when synchronization is achieved. Two points designated by symbols T in the respective drawings are correlation values determined by the sync correlation mixers, and points designated by symbols A represent correlation values determined by the demodulation correlation mixers. As illustrated, it is possible to detect a state of synchronization with the received pulse in which correlation operation is performed by shifting at regular intervals the phase of the internally-generated pulse input to each of the correlation mixers.

FIG. 18A shows a state where optimum demodulation can be performed while synchronization is achieved, wherein a value output from the demodulation correlation mixer becomes maximum and two values output from the sync correlation mixers becomes equal to each other. FIGS. 18B and 18C show a state where synchronization is not achieved as a result of the received pulse and the internally-generated pulse being out of phase with each other in the demodulation correlation mixer. A difference arises in two output values from the sync correlation mixers.

The related-art device operates so as to change timing of the internally-generated pulse in such a way that the difference comes to zero by comparison of two correlation values of the sync correlation mixers 405 and 410 through use of an adder 415, to thus assure synchronization. As mentioned above, the invention described in Patent Document 1 enables receipt of wirelessly-transmitted pulse signals and demodulation of the signals while assuring synchronization by means of a configuration having in parallel a demodulation system using a correlator and a synchronization system.

Patent Document 1: JP-T-2005-518111 (FIG. 4, FIG. 5, FIG. 12A, FIG. 12B, and FIG. 14A to FIG. 14C)

DISCLOSURE OF THE INVENTION

Problem that the Invention is to Solve

In a terminal device that performs wireless transmission, a reduction in power consumed at the time of receiving operation is an important challenge in terms of an increase in usable time. When a pulse-like signal, such as that mentioned above, is wirelessly transmitted, transmission power consumed by a transmitting device is not so large as that required by a system, such as a cellular communications system. Intermittent operation of a circuit can be performed in accordance with presence or absence of a transmission pulse signal; hence, an attempt can be made to reduce power consumption.

However, a receiver device must always be in a standby status for receiving a propagating wireless signal, which poses difficulty in performance of intermittent operation. Hence, it is difficult to attempt to reduce power consumption. For this reason, the receiver device is particularly required to decrease power consumption as much as possible.

Over against such a request, the invention described in Patent Document 1 has a configuration of each of the demodulation system and the synchronization system requiring an AD converter that operates at the same sampling frequency as a transmission rate of data. When high-speed pulse transmission of the order of gigabits-per-second is performed, heavy power is consumed.

The present invention has been conceived to solve such a problem in the related art and aims at enabling a reduction in power consumption of the receiver device that performs sync and demodulation processing, in connection with wireless transmission of a high-speed pulse signal of the order of gigabits-per-second.

In particular, the present invention is applicable to a receiving system of a wireless system that transmits data at a high transmission rate by means of a transmission scheme, such as a UWB, and aims at providing a pulse-sync demodulator that operates with low power consumption by means of a simple configuration. Moreover, the present invention also pursues cost reduction and aims at providing a pulse-sync demodulator that is easy to design in terms of higher packaging density.

Means for Solving the Problem

A pulse-sync demodulator of the present invention is a pulse-sync demodulator that receives a pulse signal of a first frequency, comprising: a clock signal generation section that generates a clock signal of a second frequency which is lower than the first frequency; a plurality of AD conversion sections that sample the pulse signal at different sampling timings of the clock signal; a phase determination section that generates a phase control signal in accordance with magnitudes of a plurality of sampled values output from the plurality of AD conversion sections; a variable delay section that changes an amount of delay in the clock signal generated by the clock signal generation section in accordance with the phase control signal; and a plurality of sampling timing adjustment sections that are provided in correspondence with the plurality of AD conversion sections, respectively, and that can individually adjust the amount of delay in the clock signal output from the variable delay section.

According to the configuration, synchronization with the received pulse signal is enabled by the plurality of AD conversion sections that operate at a sampling frequency which is lower than the transmission rate; hence, power consumed at the time of operation for synchronization with a high-speed pulse transmission system can be reduced. Further, the AD conversion sections can operate at a clock frequency that is lower than the transmission rate, so that a design for integration is also facilitated.

The pulse-sync demodulator of the present invention further comprises a level determination section that detects levels of the plurality of sampled values output from the plurality of AD conversion sections and that increases or decreases the amount of delay in the variable delay-section by a predetermined amount when the levels of the plurality of sampled values become lower than a preset value.

According to the configuration, when levels of the plurality of sampled values become smaller than a preset value, the amount of delay in the variable delay section is increased or decreased by a predetermined amount; hence, erroneous synchronization operation can be avoided. Further, since synchronous capture of a sampled value at a low value can be prevented, the degree of stability of synchronization can be enhanced.

The pulse-sync demodulator of the present invention is further characterized in that the level determination section changes the amount of delay in the variable delay section in a synchronization process for synchronizing the clock signal to the pulse signal when the plurality of sampled values output from the plurality of AD conversion sections are different from each other, and holds the amount of delay in the variable delay section in the synchronization process for synchronizing the clock signal to the pulse signal when the plurality of sampled values output from the plurality of AD conversion sections become equal to each other.

The pulse-sync demodulator of the present invention is characterized in that a difference ($\Delta\tau$) among amounts of delay in the plurality of sampling timing adjustment sections is set to values which are equal to or smaller than a half width of the amplitude of the pulse signal in the synchronization process; and the amount of delay in the variable delay section is increased or decreased for a period of time corresponding to one-half of a pulse width of the pulse signal when a plurality of sampled values output from the plurality of AD conversion sections come to values which are smaller than one-half of the amplitude of the pulse signal.

According to the configuration, when the plurality of sampled values become smaller than one-half of the amplitude of the pulse signal, the amount of delay in the variable delay section is increased or decreased for a period of time corresponding to one-half of the pulse width of the pulse signal, whereby amounts of control of delay in the sampling timing adjustment sections and the variable delay section are determined. Hence, there can be provided a device that avoids occurrence of erroneous synchronization operation and that is enhanced in terms of the degree of stability synchronization.

The pulse-sync demodulator of the present invention further comprises a demodulation processing section that demodulates the plurality of sampled values output from the plurality of AD conversion sections and output results of demodulation.

According to the configuration, the plurality of AD conversion sections operating at a sampling frequency which is lower than the transmission rate enable synchronization and demodulation of a received pulse signal; hence, power consumed at the time of synchronization with and demodulation of a high-speed pulse transmission system can be reduced. Moreover, there is adopted a configuration in which a synchronization processing section and a demodulation processing section are partially shared, and therefore a circuit scale is reduced.

The pulse-sync demodulator of the present invention further comprises a demodulation AD conversion section that samples the pulse signal at predetermined sampling timing of the clock signal; and a demodulation processing section that demodulates a plurality of sampled values output from the demodulation AD conversion sections and outputs results of demodulation.

According to the configuration, synchronization with the received pulse signal is enabled by the plurality of synchronization AD conversion sections operating at a sampling frequency which is lower than the transmission rate, and power consumed at the time of synchronization with a high-speed pulse transmission system can be diminished. Moreover, synchronization and demodulation can be simultaneously performed by provision of the demodulation AD conversion section, and synchronous capture performed during demodulation becomes possible. Consequently, when compared with a case where synchronization and demodulation are alternately performed, padding of a data pattern for synchronization purpose can be reduced, thereby making it possible to enhance a throughput.

In the pulse-sync demodulator of the present invention, the pulse signal is a pulse signal wirelessly transmitted by means of ASK modulation; and the demodulation processing section determines presence or absence of a symbol pulse by means of the sampled values output from the demodulation AD conversion section and performs control operation, when determining that the symbol pulse is absent, in such a way that a sampled value of the synchronization AD conversion section corresponding to the symbol pulse is not used for phase determination performed by the phase determination section.

According to the configuration, in a case where synchronization and demodulation are simultaneously performed, even when the symbol pulses "1" and "0" are mixedly present, achievement of synchronization can be performed by preventing an error in synchronization control, whereby an attempt can be made to enhance synchronization performance, such as a jitter characteristic.

In the pulse-sync demodulator of the present invention, the second frequency is the one-$n^{th}$ ("n" is an integer of two or more) of the first frequency, and the plurality of AD conversion sections are connected in number of "n" to the pulse signal in parallel and generates "n" sampled values.

According to the configuration, the plurality of AD conversion sections operating at a sampling frequency which is equal to or smaller than one-half of the transmission rate enable synchronization with a received pulse signal; hence, power consumed at the time of synchronization with a high-speed pulse transmission system can be reduced.

In the pulse-sync demodulator of the present invention, the plurality of AD conversion sections respectively sample "n" different symbols of the pulse signal.

In the pulse-sync demodulator of the present invention, the phase determination section controls the amount of delay in the variable delay section such that the plurality of sampled values output from the plurality of AD conversion sections become equal to each other.

In the pulse-sync demodulator of the present invention, a difference ($\Delta\tau$) among the amounts of delay adjusted by the plurality of sampling timing adjustment sections is smaller than a pulse width of the pulse signal.

In the pulse-sync demodulator of the present invention, the plurality of sampling timing adjustment sections cause the difference ($\Delta\tau$) in the amounts of delay in the synchronization process for synchronizing the clock signal to the pulse signal and sets the difference ($\Delta\tau$) in the amounts of delay to zero at the time of demodulation of the pulse signal.

In the pulse-sync demodulator of the present invention, the plurality of AD conversion sections further include a first AD conversion section that samples the pulse signal at a leading edge of the clock signal; and a second AD conversion section that samples the pulse signal at a trailing edge of the clock signal.

According to the configurations, an extent to which the amounts of delay in the sampling timing adjustment sections are switched between at the time of synchronization and at the time of demodulation can be made small. Discontinuity of the phase arising at the time of switching can be reduced when compared with the case where the amounts of delay are greatly switched.

The pulse-sync demodulator of the present invention further comprises a clock frequency correction section that detects a given amount of change from changes in the phase control signal generated by the phase determination section, thereby adjusting a frequency of the clock signal output from the clock signal generation section in accordance with an increment/decrement in the amount of change and a gradient of the same.

According to the configuration, even when the frequency of the clock signal achieved at the transmission end differs from the frequency of the clock signal achieved at the receiving end, adjustment can be performed such that the frequency of the clock signal achieved at the receiving end becomes equal to the frequency of the clock signal achieved at the transmission end. Time lags in sampling points optimum at the time of demodulation, which would otherwise be caused as a result of elapse of a time, are reduced, and synchronization demodulation performance can be enhanced.

In the pulse-sync demodulator of the present invention, the plurality of sampling timing adjustment sections generate the difference ($\Delta\tau$) in the amounts of delay in the synchronization process for synchronizing the clock signal to the pulse signal and reduces the difference ($\Delta\tau$) in the amounts of delay with progress in the synchronization process.

According to the configuration, an extent to which the amounts of delay in the sampling timing adjustment sections are switched between at the time of synchronization and at the time of demodulation can be made small. Discontinuity of the phase arising at the time of switching can be reduced when compared with the case where the amounts of delay are greatly switched.

Advantage of the Invention

According to the present invention, synchronization with a received pulse signal can be achieved by means of a plurality of AD conversion sections operating at a sampling frequency which is lower than a transmission rate; hence, power consumed by operation for synchronization with a high-speed pulse transmission system can be reduced. Moreover, the AD conversion sections can be operated at a clock frequency that is lower than the transmission rate, so that a design for integration becomes easy.

BRIEF DESCRIPTION OF THE DRAWINGS

FIG. 14 is a timing chart showing a received pulse signal acquired at the time of synchronization achieved by the pulse-sync demodulator of the fifth embodiment.

Figure 1:
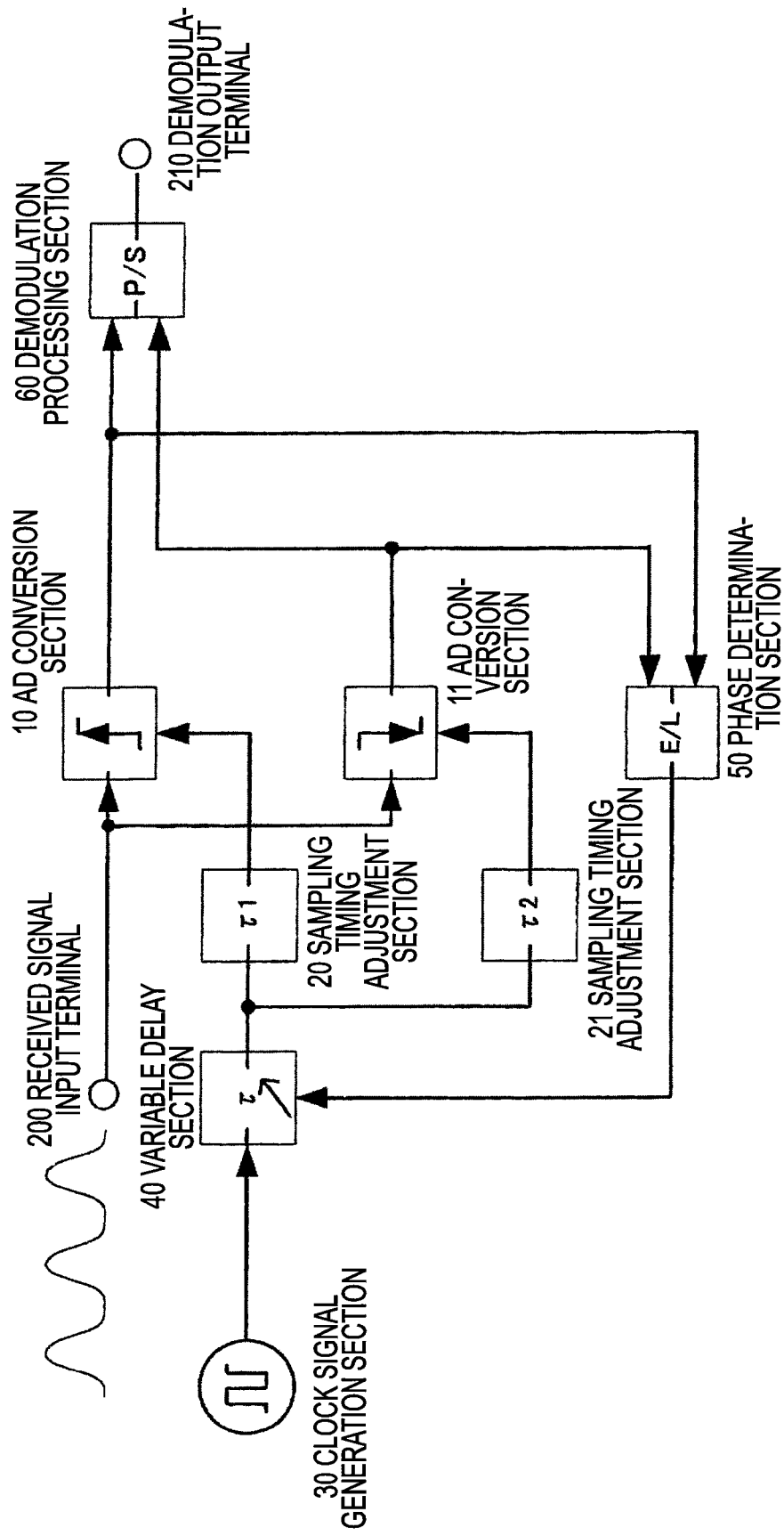
FIG. 1 is a block diagram showing an example configuration of a pulse-sync demodulator of a first embodiment.

DESCRIPTIONS OF THE REFERENCE NUMERALS 10, 11, 12 AD CONVERTER SECTIONS
20, 21, 22 SAMPLING TIMING ADJUSTMENT SECTIONS
30 CLOCK SIGNAL GENERATION SECTION
40 VARIABLE DELAY SECTION
50 PHASE DETERMINATION SECTION
60 DEMODULATION PROCESSING SECTION
70 LEVEL DETERMINATION SECTION
200 RECEIVED SIGNAL INPUT TERMINAL
210 DEMODULATION OUTPUT TERMINAL
201, 202, 203, 204, 205, 206 RECEIVED PULSE SIGNALS
15, 16, 17 CLOCK SIGNALS
301 TO 312 SAMPLES

BEST MODES FOR IMPLEMENTING THE INVENTION

In embodiments provided below, a pulse-sync demodulator that receives a signal wirelessly transmitted by means of an on-off keying modulation scheme will be described. In the following embodiments, like configurations are assigned like reference numerals, and their overlapping explanations are omitted.

(First Embodiment)

FIG. 1 is a block diagram showing an example configuration of a pulse-sync demodulator of a first embodiment. As shown in FIG. 1, a pulse-sync demodulator of the first embodiment has a received signal input terminal 200, AD conversion sections 10 and 11, sampling timing adjustment sections 20 and 21, a clock signal generation section 30, a variable delay section 40, a phase determination section 50, a demodulation processing section 60, and a demodulation output terminal 210.

Figure 2:
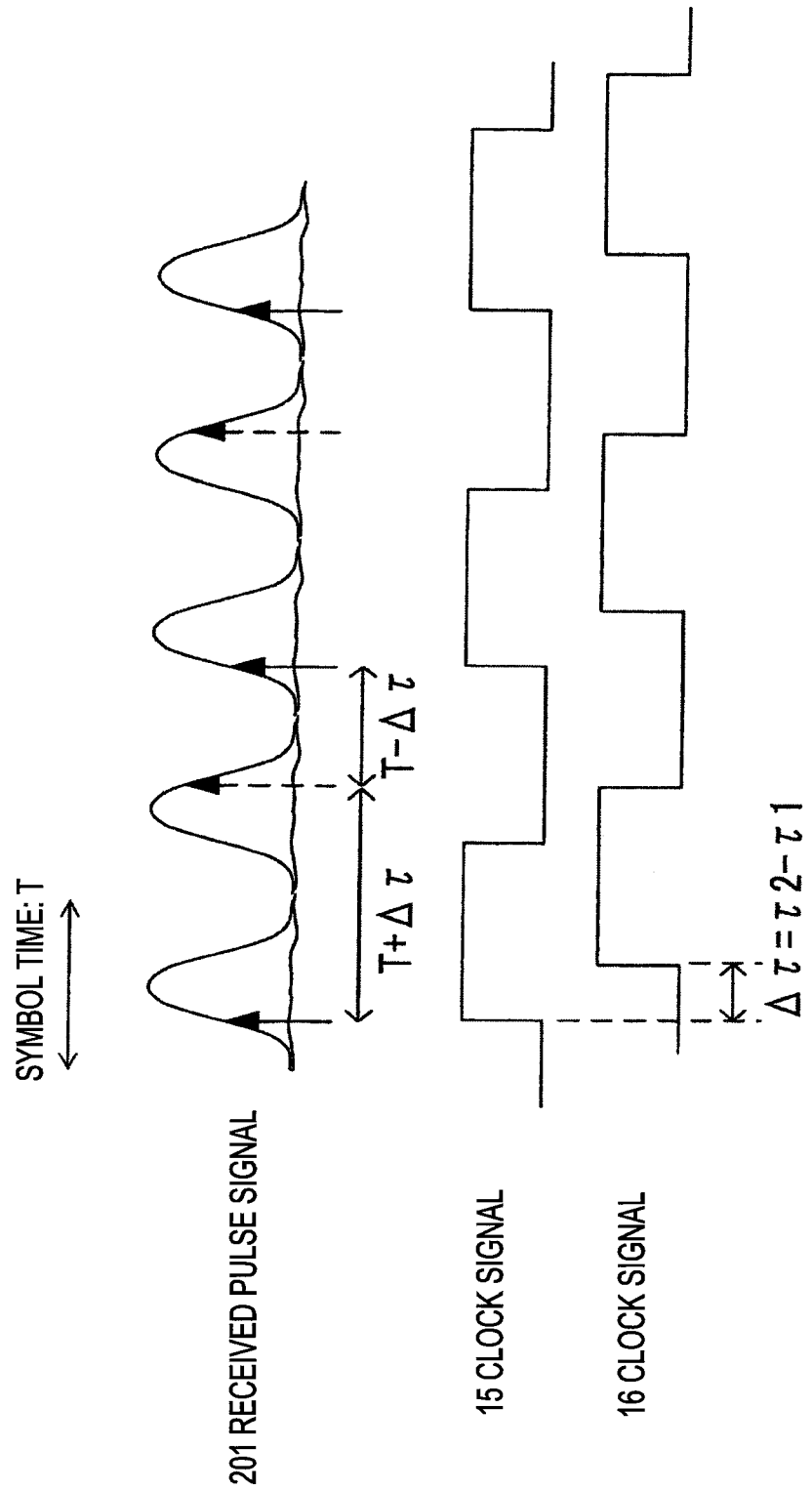
FIG. 2 is a timing chart showing a received pulse signal acquired at the time of synchronous pull-in operation performed by the pulse-sync demodulator of the first embodiment.

A received pulse modulation signal, which has undergone on-off keying modulation, is input to the received signal input terminal 200. The on-off keying modulation scheme is an ASK (Amplitude Shift Keying) modulation scheme which exhibits a modulation level of 100% and by means of which a "1" or "0" digital signal is transmitted according to presence or absence of a pulse signal. When modulation is assumed to be performed by means of an RZ pulse signal and when data "1" are continuously transmitted from a transmission end, a continuous pulse waveform, such as that designated by 201 in FIG. 2, is assumed to be received by a receiving end.

A modulation signal is generated by assigning the pulse to the data "1" and not transmitting the pulse to the data "0." Alternatively, the pulse may also be assigned to the data "0," and the essential requirement is that a method for assigning data to the pulse be shared between the receiving and transmission ends. In the present embodiment, an explanation is given to a case where presence of pulse is assigned data "1."

When a wireless signal is transmitted by means of a carrier wave frequency band, a received signal generated by converting the signal into a baseband range by means of a down converter, a detector, and the like, is input. The pulse-sync demodulator of the present embodiment synchronizes to the received pulse signal, to thus demodulate the signal.

The AD conversion sections 10 and 11 sample an amplitude value of the received pulse signal input by way of the received signal input terminal 200, thereby converting the sampled value into a digital value. The received pulse signal is bifurcated, and the two signals are simultaneously input to the AD conversion sections 10 and 11, respectively.

A clock signal for imparting sampling timing as well as the received pulse signal are input to the AD conversion sections 10 and 11. The frequency of the clock signal comes into use as a sampling frequency. In both synchronization and demodulation processes, the AD conversion sections 10 and 11 alternately sample the received pulse signal every symbol by means of a sampling frequency that is one-half of the transmission rate.

The AD conversion section 10 operates so as to sample the received pulse signal at a leading edge of the clock signal, and the AD conversion section 11 operates so as to sample the received pulse signal at a trailing edge of the clock signal.

The sampling timing adjustment sections 20 and 21 adjust the delay of the clock signal that imparts sampling timing to the AD conversion sections 10 and 11. The sampling timing adjustment section 20 is connected so as to adjust sampling timing of the AD conversion section 10, and the sampling timing adjustment section 21 is connected so as to adjust sampling timing of the AD conversion section 11.

At the time of receiving operation, timing for synchronization with the received pulse signal is first acquired, and demodulation is then performed by means of an amplitude level of the received pulse signal. However, in a process for achieving synchronization and a process for performing demodulation, operation is performed such that amounts of delay in the clock signal in the sampling timing adjustment sections 20 and 21 is switched. This will be described later by reference to FIG. 2.

The clock signal generation section 30 generates a clock signal for imparting sampling timing to the AD conversion sections 10 and 11. Provided that the number of AD conversion sections connected in parallel is "n," the frequency of a clock signal to be generated is set so as to come to one-$n^{th}$ of the transmission rate. For instance, when a 1-Gbps data signal is received, a 500-MHz clock signal, which is one-half of the transmission rate, is generated in the present configuration where two AD conversion sections are provided in parallel.

In accordance with a control signal from the phase determination section 50, the variable delay section 40 changes an amount of delay in the clock signal output from the clock signal generation section 30, and sends outputs to the sampling timing adjustment sections 20 and 21. A range where the amount of delay is changeable is set to at least one symbol time of the received pulse signal, thereby enabling changing of, through 360°, a phase for sampling the received pulse signal in the AD conversion sections 10 and 11.

The phase determination section 50 compares sampled values of the received pulse signals output from the AD conversion sections 10 and 11, thereby determining a phase for sampling the received pulse signal in the AD conversion sections 10 and 11, and controls the amount of delay in the variable delay section 40 so that sampling timing optimum for demodulation is achieved. This will be described later by reference to FIG. 2.

The demodulation processing section 60 determines the sampled values pertaining to the received pulse signal output from the AD conversion sections 10 and 11 by reference to a threshold value, and demodulates the data. The received pulse signal is alternately sampled every symbol by the AD conversion sections 10 and 11; hence, a demodulated data sequence is output after having been subjected to 2-to-1 parallel-to-serial conversion.

The demodulation output terminal 210 outputs the data sequence demodulated by the demodulation processing section 60 at the same speed as the transmission rate. By means of the foregoing configuration, the device shown in FIG. 1 can demodulate the received pulse signal by achieving synchronization. A configuration of the AD conversion section for synchronization and demodulation being shared is attained.

Figure 3:
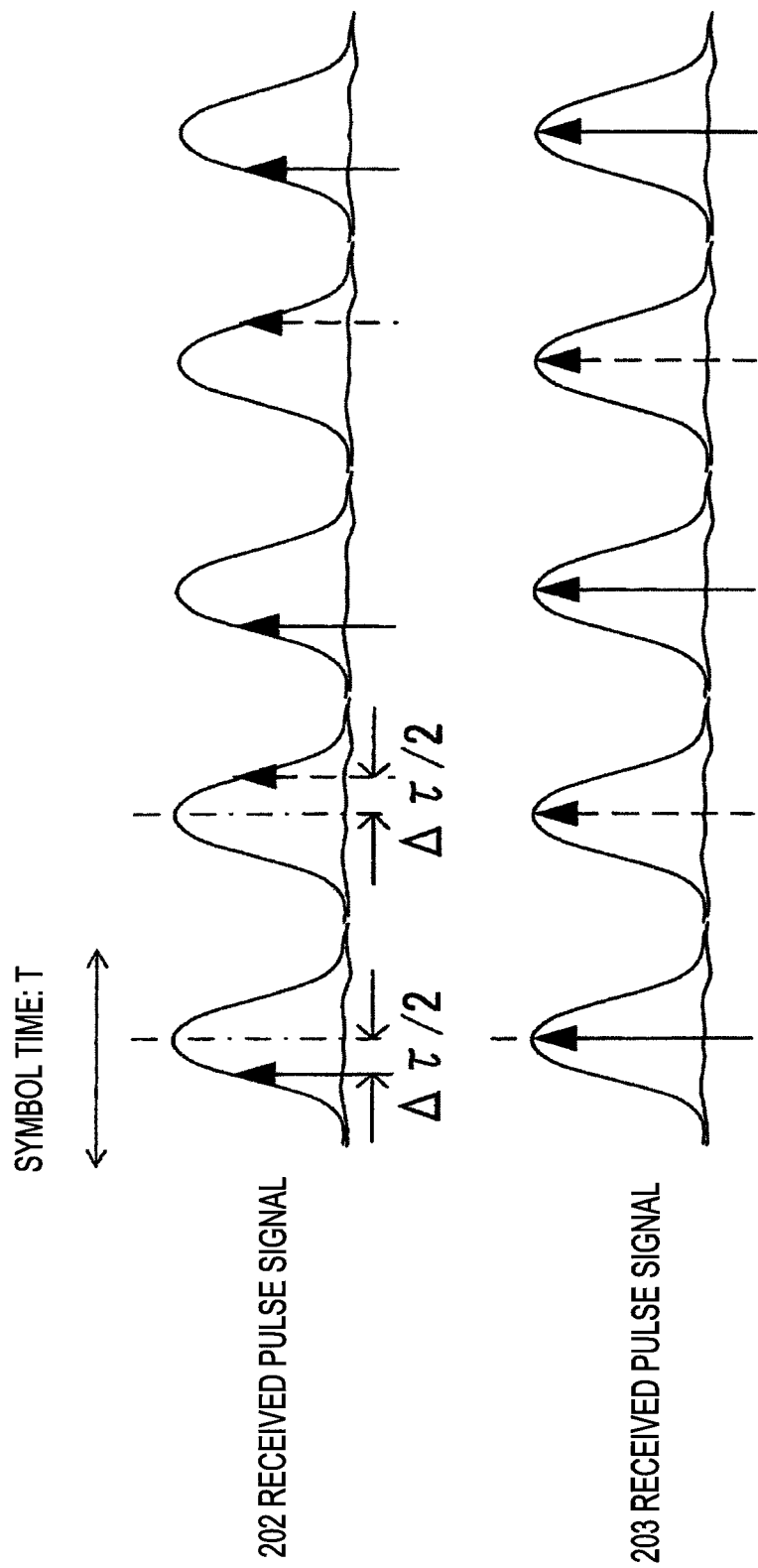
FIG. 3 is a timing chart showing a received pulse signal acquired at the time of synchronization and demodulation achieved and performed by the pulse-sync demodulator of the first embodiment.

A specific example synchronization method for the pulse-sync demodulator of the first embodiment will now be described by reference to FIGS. 2 and 3. FIG. 2 is a timing chart showing operation performed in the course of synchronization with the received pulse signal. FIG. 3 is a timing chart showing operation performed when synchronization with the received pulse signal is achieved.

FIG. 2 shows operation performed in the course of synchronization with the received pulse signal, and a received pulse signal 201 and clock signals 15 and 16 are illustrated. The received pulse signal 201 shown in FIG. 2 is a received signal input by way of the received signal input terminal 200. At timing for achieving synchronization, the transmission ends continuously transmits data "1," and the receiving end continuously receives the pulse signal. In the present embodiment, the transmission signal is assumed to be modulated by the RZ pulse. However, provided that a transmission signal is modulated by an NRZ pulse, a waveform analogous to that of the received pulse signal 201 can be received by alternately transmitting data "1" and data "0" from the transmission end at timing for achieving synchronization.

The received pulse signal 201 is simultaneously input to the AD conversion sections 10 and 11. As illustrated, symbol pulses of the received pulse signals are present within a symbol time T, and a symbol interval is also set to time T. Therefore, the transmission rate achieved in this case comes to one-$T^{th}$ part thereof. Further, the waveform of the symbol pulse is presumed to assume an essentially-symmetrical pattern analogous to that of a Gaussian mono pulse.

A clock signal 15 shows a clock signal input to the AD conversion section 10, and a clock signal 16 shows a clock signal input to the AD conversion section 11. The frequency of the clock signal is one-half of the transmission rate, and a period of the signal is twice as large as the symbol time. T. At the time of synchronization, operation is performed by shifting timing of the clock signal by $\Delta\tau$.

The amount of phase shift $\Delta\tau$ is adjusted by the sampling timing adjustment sections 20 and 21. Provided that the amount of delay in the sampling timing adjustment section 20 is $\tau 1$ and that the amount of delay in the sampling timing adjustment section 21 is $\tau 2$, the amount of phase shift $\Delta\tau$ is given by a difference between $\tau 2$ and $\tau 1$. The amount of phase shift $\Delta\tau$ is set to a time interval that is shorter than the symbol time T.

The AD conversion section 10 samples the input received pulse by means of a leading edge of the clock signal 15, and the AD conversion section 15 samples the input received pulse by means of the trailing edge of the clock signal 16 shifted by $\Delta\tau$.

The manner of sampling operation is indicated by arrows in connection with the received pulse signal 201. Arrows of solid lines indicate the manner of sampling operation performed by the AD conversion section 10 through use of the clock signal 15, and arrows of broken lines indicate the manner of sampling operation performed by the AD conversion section 11 through use of the clock signal 16.

As illustrated, the AD conversion sections are caused to operate in such a way that one conversion section performs sampling at the leading edge of the clock signal and that the other conversion section performs sampling at the trailing edge of the clock signal, thereby making it possible to set the amount of phase shift $\Delta\tau$ so as to become smaller than the symbol time T. The AD conversion sections 10 and 11 operate so as to alternately sample the continuous, received pulse signal. The AD conversion sections 10 and 11 operate so as to perform sampling at two different phase points of the symbol pulse.

The phase determination section 50 compares values of the received pulse signal 201 sampled by the AD conversion sections 10 and 11, thereby controlling the variable delay section 40. When the sampled values of the AD conversion section 10 indicated by the arrows of solid lines are greater than the sampled values of the AD conversion section 11 indicated by the arrows of broken lines, control is performed so as to make the amount of delay $\tau$ in the variable delay section 40 small. When the sampled values of the AD conversion section 10 indicated by the arrows of solid lines are smaller than the sampled values of the AD conversion section 11 indicated by the arrows of broken lines, control is performed so as to make the amount of delay $\tau$ in the variable delay section 40 large.

At the time of synchronization, the sampled values are alternately output at time intervals of $(T+\Delta\tau)$ and $(T-\Delta\tau)$ from the AD conversion sections 10 and 11, and hence the phase determination section 50 performs comparison and determination of the sampled values in consideration of the timings.

An increment or a decrement in the amount of delay τ in the variable delay section 40 is controlled by the phase determination section 50. It is only essential that an increment or decrement in the amount of delay τ be set to a given positive or negative level in accordance with a determination result showing which one of the sampled values of the AD conversion sections 10 and 11 is greater.

In actual control operation, adjustment is performed such that a relationship of the symbol time T>the amount of phase shift Δτ>the amount of delay τ (a given amount) stands. In this case, an approximate value of the amount of phase shift Δτ is set to about 20 to 80% of the symbol time T, and an approximate value of the amount of delay τ is set to, at most, one-half or less of the amount of phase shift Δτ. The numerical values are set so as to vary according to requested specifications. Specifically, when early convergence of synchronization operation is desired, the amount of phase shift Δτ is made broad. In contrast, when an improvement in a jitter characteristic achieved at the time of achievement of synchronization is desired, the amount of phase shift is set so as to become narrow.

It may also be better to change the amount of increment or decrement in the delay amount τ in accordance with the degree of a level difference between the sampled value of the AD conversion section 10 and the sampled value of the AD conversion section 11. For instance, when the level difference is large, it may also be better to increase the amount of increment or decrement. When the level difference becomes small, it may also be better to enable performance of fine adjustment by reducing the amount of increment or decrement. When adjustment is performed as in the case of the latter, adjustment for shortening a time elapsing before achievement of synchronization and reducing the amount of jitter arising at the time of achievement of synchronization becomes feasible.

FIG. 3 shows operation performed at the time of achievement of synchronization and demodulation of the received pulse signal, and received pulse signals 202 and 203 are illustrated.

The received pulse signal 202 shown in FIG. 3 is provided with arrows of solid lines and arrows of broken lines that designate sampling timings of the AD conversion sections 10 and 11 achieved in a state where synchronization is achieved. In the state where synchronization is achieved, the amount of delay in the variable delay section 40 is controlled by the phase determination section 40 such that the values sampled by the AD conversion sections 10 and 11 become equal to each other. A state where the sampled values of the AD conversion sections 10 and 11 become equal to each other as a result of changing of the amount of delay τ is taken as a synchronized state, and processing then proceeds to demodulation operation after the synchronized state has been assured for a given period of time.

When processing shifts from synchronization operation to demodulation operation, the amount of delay τ in the variable delay section 40, for which synchronization is assured, is held, and the amounts of delay in the sampling timing adjustment sections 20, 21 are switched. Specifically, the amount of delay τ1 in the sampling timing adjustment section 20 acquired at the time of synchronization is increased by Δτ/2, and the amount of delay τ2 in the sampling timing adjustment section 21 is decreased by Δτ/2.

Consequently, the amounts of delay in the sampling timing adjustment sections 20 and 21 achieved at the time of demodulation become equal to each other. Since the amount of phase shift Δτ is set so as to become smaller than the symbol time T, an extent to which the amounts of delay in the sampling timing adjustment sections 20 and 21 are switched between at the time of synchronization and at the time of demodulation can be made small. Discontinuity of the phase arising at the time of switching can be reduced when compared with the case where the amounts of delay are greatly switched.

The received pulse signal 203 shown in FIG. 3 is provided with arrows of solid lines and arrows of broken lines that designate sampling timings of the AD conversion sections 10 and 11 achieved at the time of demodulation. The AD conversion sections 10 and 11 operate so as to alternately sample a symbol pulse. By means of operation for switching the amounts of delay in the sampling timing adjustment sections 20, 21, sampling is performed at timing where the amplitude of the center of the symbol pulse becomes highest, whereby an optimum SN ratio is acquired, as shown in FIG. 3.

Sampled values of the AD conversion sections 10, 11 are input to the demodulation processing section 60, where a determination is made as to whether the symbol assumes a value of "1" or "0" by a threshold value determination. A determination result is output after being subjected to parallel-to-serial conversion, whereby a demodulated data sequence is generated. The timings at which the AD conversion sections 10 and 11 output sampled values are input to the demodulation processing section 60 with a lag equivalent to the symbol time T; hence, a demodulation result is converted into a serial data sequence through parallel-to-serial conversion in consideration of a lag in the timings.

Gradually switching the amounts of delay in the sampling timing adjustment sections 20, 21 when processing shifts from synchronization operation to demodulation operation is effective for preventing adverse effects resulting from occurrence of jitter assumed to be discontinuous operation that would arise at the time of switching. Specifically, in FIG. 3 sampling timing of Δτ/2 is gradually shifted rather than being changed at a stroke.

At an initial phase of synchronized pull-in operation, a certain wide extent of difference in the amounts of delay (Δτ: a difference between the amount of delay τ1 in the sampling timing adjustment section 20 and the amount of delay τ2 in the sampling timing adjustment section 21) is assured for achieving high-speed pull-in operation. In the latter half of the synchronization process (at the time of synchronized pull-in operation) where a certain degree of synchronization has been achieved, the difference in the amounts of delay (Δτ) is reduced so as to become close to sampling timing effective for demodulation.

The degree of synchronized pull-in operation serves as a criteria for determining the difference in the amounts of delay in the sampling timing adjustment sections 20, 21. For instance, one conceivable means is to reduce the difference in the amounts of delay (Δτ) as the amount of adjustment of the variable delay section 40 becomes smaller; namely, as the synchronization processes elapses. When a synchronization process time is defined, operation may also be performed in such a way that a gradual change arises within the period of the time.

Since the AD modulation sections 10, 11 are used for both synchronization and demodulation, power consumption can be reduced when compared with a configuration in which an AD conversion section that operates at a sampling frequency of the transmission rate is additionally provided for demodulation purpose separately from the AD conversion section required for synchronization. Further, there is also yielded an advantage of the ability to reduce operating clock frequencies of the AD conversion sections 10, 11.

It has generally been known that power consumed by the AD conversion section is proportional to its operating frequency. In consideration of only the fact, when one AD conversion section that operates at a 1-GHz sampling frequency is used as; for instance, a circuit that samples 1-Gbps received pulse signal, to thus perform demodulation, and when two AD conversion sections that operate at a 500-MHz sampling frequency are used as the circuit, the circuits operate at the same power consumption.

However, in reality, in a device that operates at such a high-speed clock frequency in excess of 1 GHz, a peripheral circuit, such as an operational amplifier, must also operate simultaneously at a high operation frequency. Power consumption sometimes increases in excess of a proportional amount for reasons that a bias current, which is equal to or greater than a proportional increase, is required to exploit the performance of a processor close to its limit of ability.

Even in circuits other than the AD conversion section, such as the phase determination section and the variable delay section, power consumption increases with an increase in operating clock frequency. Consequently, in particular, when there is implemented a device that synchronously demodulates a received signal at a rate of transmission of the order of gigabits-per-second, the configuration of the embodiment of the present invention becomes superior to a configuration including a circuit element that operates at a clock frequency of the order of gigahertz in terms of power consumption of the overall device.

The configuration enabling a reduction in operating clock frequency, which is a characteristic of the present invention, also yields an advantage of facilitation of device packaging. When a clock signal is fast, close attention must be paid to crosstalk to another line, line delay control, equal-length wiring, and the like, and great efforts are consumed by a layout design, and the like, intended for coping with constraints; hence, an increase in design const is conceivable.

According to the present invention that enables a reduction in clock signal, the problem is resolved, and a device that is easy to design and entails low design cost can be configured. In relation to the AD conversion sections used in the present embodiment, the operating clock frequency that is equal to or less than one-half of the transmission rate is sufficient, so long as operation is attained. However, attention must be paid to the fact that a band width equal to or greater than the transmission rate is required as an operable frequency band for an analogue input.

In the present embodiment, operation is performed in such a way that the amounts of delay in the sampling timing adjustment sections 20, 21 are switched between at the time of synchronization with the received pulse signal and at the time of demodulation of the received pulse signal; therefore, synchronization and demodulation cannot be simultaneously performed. During demodulation operation, timing to sample a received pulse signal may deviate with elapse of time from an optimal point where an amplitude of the symbol pulse becomes maximum. To cope with such a problem, it is better to receive data while iterating synchronization and demodulation at an appropriate time interval.

In a case where control must be performed so as to increment or decrement an extent to which the variable delay section 40 controls the amount of delay, at all times, by a constant value at the time of achievement of synchronization for reasons of a frequency difference between a reference oscillation source of the transmission end and a reference oscillation source of the receiving end, a change in the amount of delay in the variable delay section 40 arising when synchronization is achieved can be reduced by performing control so as to finely adjust the frequency of the clock signal generation section 30 in accordance with the given amount of delay control; and a duration for enabling demodulation; namely, a time elapsing before requirement of re-synchronization, can be increased by preventing a deviation from an optimum point for sampling during demodulation, which would otherwise be caused by elapse of a time. This will be described in more detail in connection with a sixth embodiment.

As mentioned above, in the first embodiment, a pulse-sync demodulator capable of performing synchronization and demodulation can be built from the AD conversion sections 10, 11 that operate at a clock frequency which is one-half of the transmission rate in connection with wireless transmission utilizing on-off keying modulation, and synchronization and demodulation operations can be performed at power consumption that is lower than that required in the related art.

Further, according to the present invention, a pulse-sync demodulator that is smaller than its related-art counterpart in terms of a circuit scale can be provided by means of the configuration that uses the AD conversion sections 10, 11 commonly as the synchronization circuit and the demodulation circuit. Moreover, according to the present invention, all constituent elements required for synchronization and demodulation operations are easy to integrate, and an advantage of cost reduction attributable to integration can be yielded.

(Second Embodiment)

Figure 4:
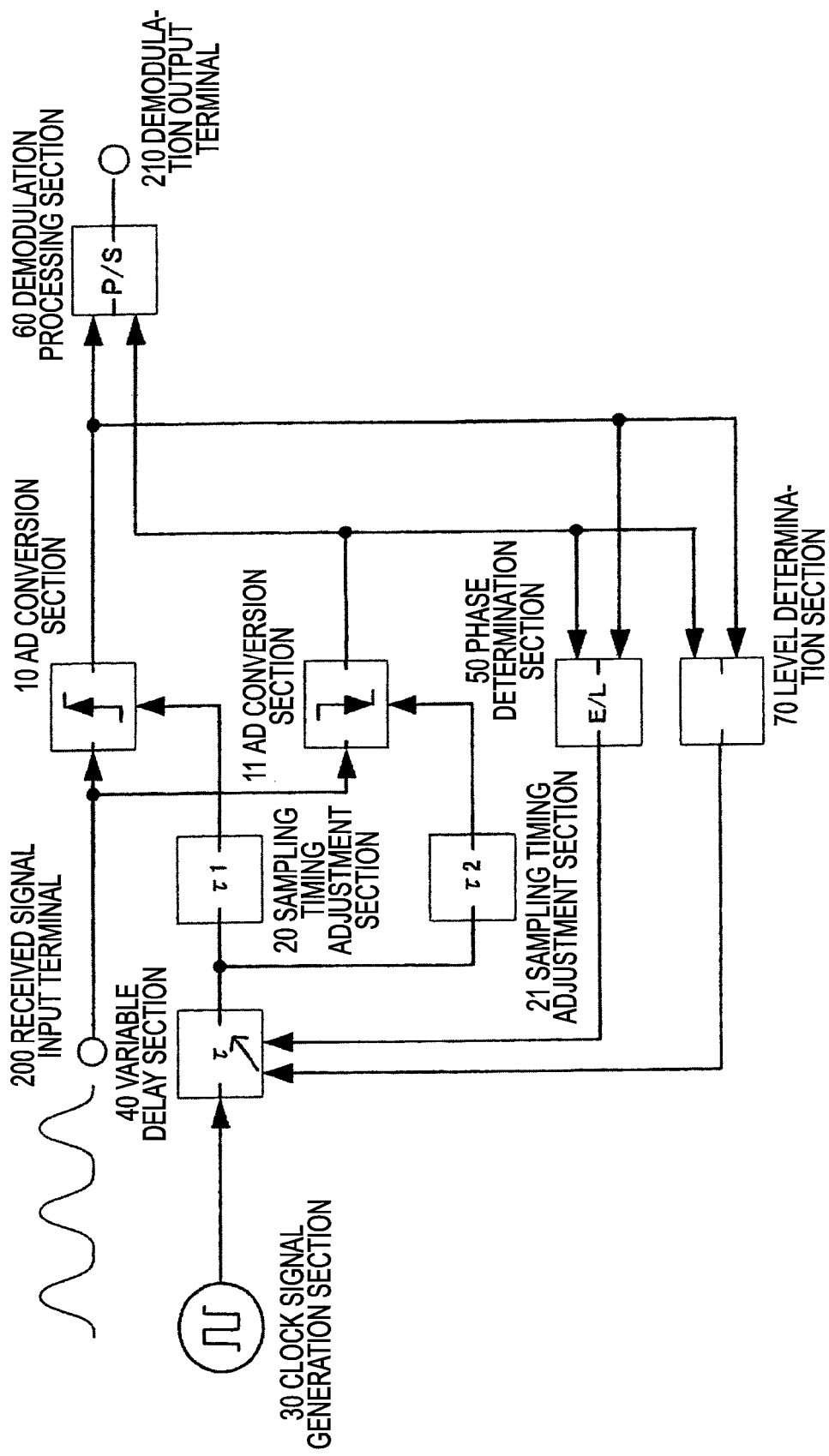
FIG. 4 is a block diagram showing an example configuration of a pulse-sync demodulator of a second embodiment.

FIG. 4 is a block diagram showing the configuration of a pulse-sync demodulator of a second embodiment of the present invention. In addition to including the configuration shown in FIG. 1, the pulse-sync demodulator of the second embodiment shown in FIG. 4 has a level determination section 70.

The level determination section 70 receives, as inputs, the sampled values of the received pulse signals output from the AD conversion sections 10 and 11. When levels of the two sampled values are smaller than a set threshold value, the level determination section operates so as to greatly shift the amount of delay in the variable delay section 40. A signal input to the level determination section 70 is the same as that input to the phase determination section 50.

Operations of the other constituent elements are the same as those described in connection with the first embodiment. By means of the foregoing configuration, the device shown in FIG. 4 can perform demodulation by achievement of synchronization with the received pulse signal.

Figure 5:
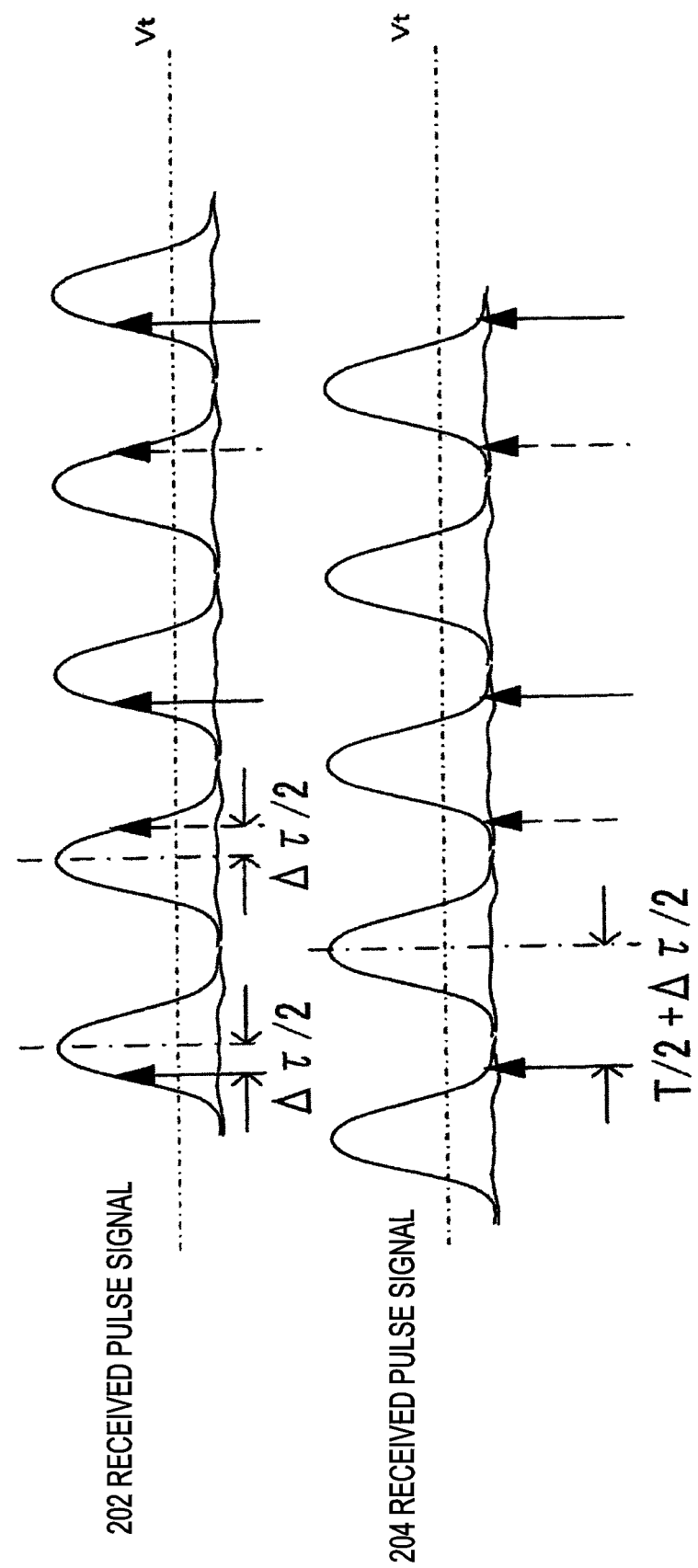
FIG. 5 is a timing chart showing a received pulse signal acquired at the time of synchronization achieved by the pulse-sync demodulator of the second embodiment.

Next, a difference between the pulse-sync demodulator of the present embodiment and its counterpart of the first embodiment will now be described by reference to FIG. 5. FIG. 5 is a timing chart showing operation performed in the course of synchronization with the received pulse signal.

When sampled values of two points of different phases of the received pulse signals acquired from the AD conversion sections 10 and 11 become equal to each other, the phase determination section 50 determines that synchronization is achieved. The received pulse signal 202 is provided with sampling timings of the AD conversion sections 10 and 11 attained at the time of achievement of synchronization in the form of arrows of solid lines and arrows of broken lines. When the pulse has a symmetry as illustrated, an optimum point for demodulation is uniquely determined at a point shifted by $\Delta\tau/2$, so long as a phase in which two sampled values become equal to each other is determined.

However, there may arise a case where two sampled values become equal to each other as indicated by the received pulse signal 204. In this case, the position of the optimal demodulation point for sampling timing becomes different from that mentioned previously.

In addition to raising a problem of determination of synchronization in an unexpected state indicated by the received pulse signal 204, comparing sampled values with each other while the values are at a low level raises a problem of being vulnerable to an error. In a domain where the level of an amplitude is low, a change in level responsive to an hourly variation is small; hence, jitter arising at the time of achievement of synchronization is likely to become large.

In the present embodiment, the above-mentioned problem can be solved. When both of the two sampled values become smaller than a previously-set value Vt as does the received pulse signal 204, the level determination section 70 controls the amount of delay in the variable delay section 40 so as to increment or decrement by a given amount. When a difference between the delay times of the two sampling timing adjustment sections 20 and 21 achieved at the time of synchronization is set so as to become equal to or smaller than a half width of the amplitude of the received pulse signal, it is better to determine the threshold value Vt used for determination as about a mesial magnitude of the amplitude.

At timing for sampling the received pulse signal 204, the signal is assumed to have shifted by about an amount corresponding to one-half of the symbol time T. Hence, when the sampled values of the received pulse signal output from the two AD conversion sections 10, 11 at the time of synchronization come to values which are smaller than the threshold value Vt, the amount of delay in the variable delay section 40 is controlled so as to increase or decrease by a time that is about one-half of the symbol time T or about one-half of a pulse width, thereby avoiding occurrence of a state indicated by the received pulse signal 204.

Such phase control to which the variable delay section 40 is subjected enables performance of an immediate shift from the state of the received pulse signal 204 including a large phase shift to a state indicated by a desired received pulse signal 202. Hence, phase control is effective for a speedup in synchronization, as well.

As mentioned above, according to the second embodiment, a pulse-sync demodulator capable of performing both synchronization and demodulation can be configured by means of the AD conversion sections 10, 11 that operate at a clock frequency that is one-half of the transmission rate in connection with wireless transmission utilizing on-off keying modulation. In addition to yielding the advantage of the first embodiment, the embodiment enables performance of high-speed synchronization in a higher likelihood.

Although the present embodiment has illustrated the example in which the level determination section 70 is additionally provided. However, the demodulation processing section 60 also has the function of determining a threshold value. Hence, there may also be adopted a configuration for causing the demodulation processing section 60 to exhibit the function of the level determination section 70 at the time of synchronization and control the variable delay section 40.

(Third Embodiment)

Figure 6:
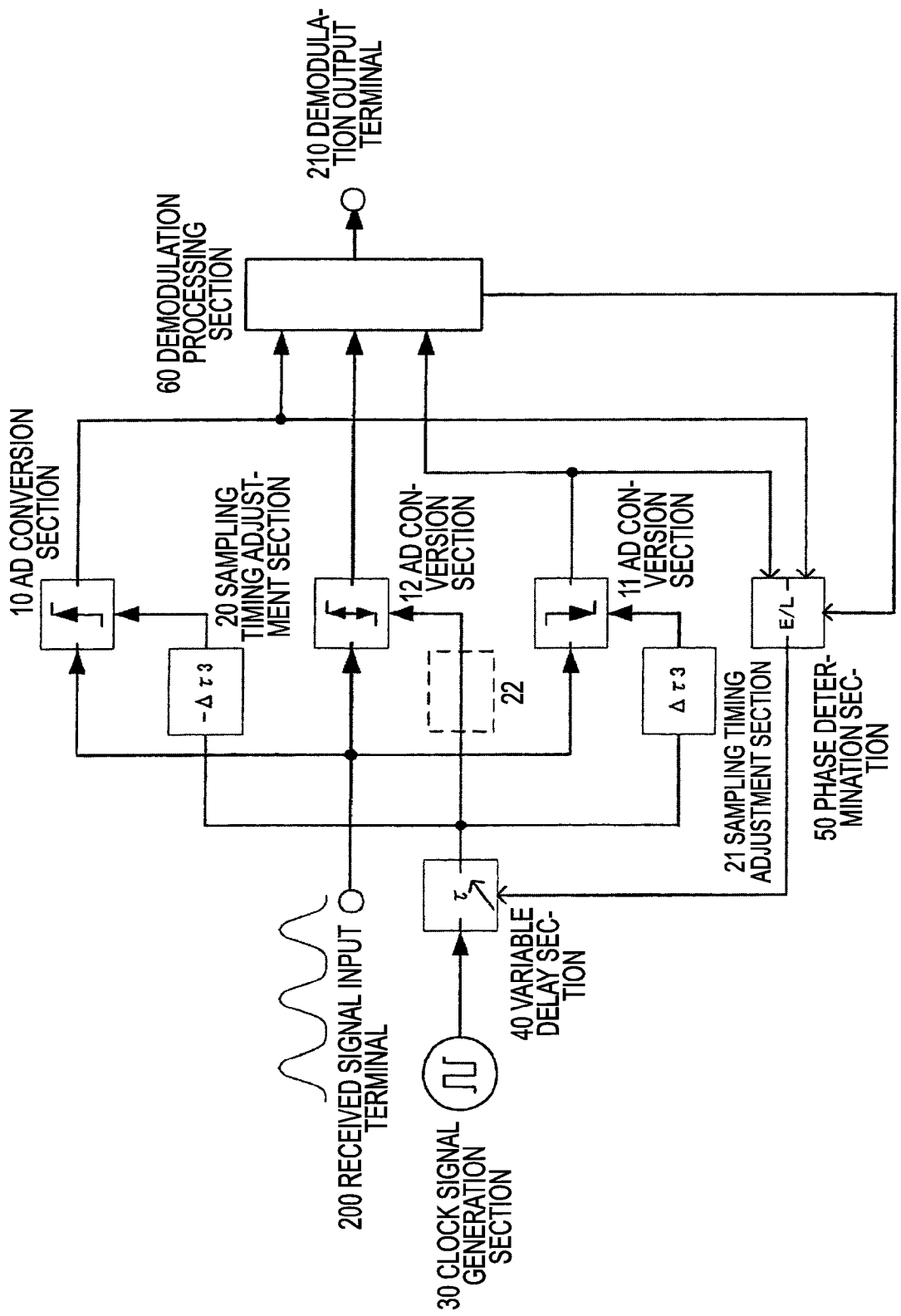
FIG. 6 is a block diagram showing an example configuration of a pulse-sync demodulator of a third embodiment.

FIG. 6 is a block diagram showing the configuration of a pulse-sync demodulator of a third embodiment of the present invention. In addition to including the configuration shown in FIG. 1, the pulse-sync demodulator of the third embodiment shown in FIG. 6 has an AD conversion section 12, and the demodulation processing section 60 has a function of controlling the phase determination section 50. In the present embodiment, a device capable of simultaneously achieving synchronization while performing demodulating operation is provided.

The AD conversion section 12 is provided in parallel with the AD conversion sections 10 and 11 and samples a received pulse signal likewise. Sampling timing is given by a clock signal output from the variable delay section 40, and the AD conversion section operates at both edges, to thus perform sampling operation equivalent to 1-GHz sampling. In the present embodiment, the AD conversion section 12 performs operation for demodulation, and the AD conversion sections 10 and 11 perform operation for synchronization.

The demodulation processing section 60 subjects a sampled value of the received pulse signal output from the AD conversion section 12 to threshold-value determination, to thus demodulate data and outputs a demodulated data sequence to a demodulation output terminal 210. The demodulation processing section 60 performs synchronization achievement operation simultaneously with demodulation; determines efficacy of sampled values output from the AD conversion sections 10 and 11 in accordance with results of demodulation of a symbol; and sends a feedback of efficacy to the phase determination section 50 that performs control for achieving synchronization.

Operations of the other constituent elements are the same as those described in connection with the first embodiment. By means of the foregoing configuration, the device shown in FIG. 6 can simultaneously achieve synchronization while demodulating a received pulse signal in addition to yielding the advantage described in connection with the first embodiment.

Figure 7:
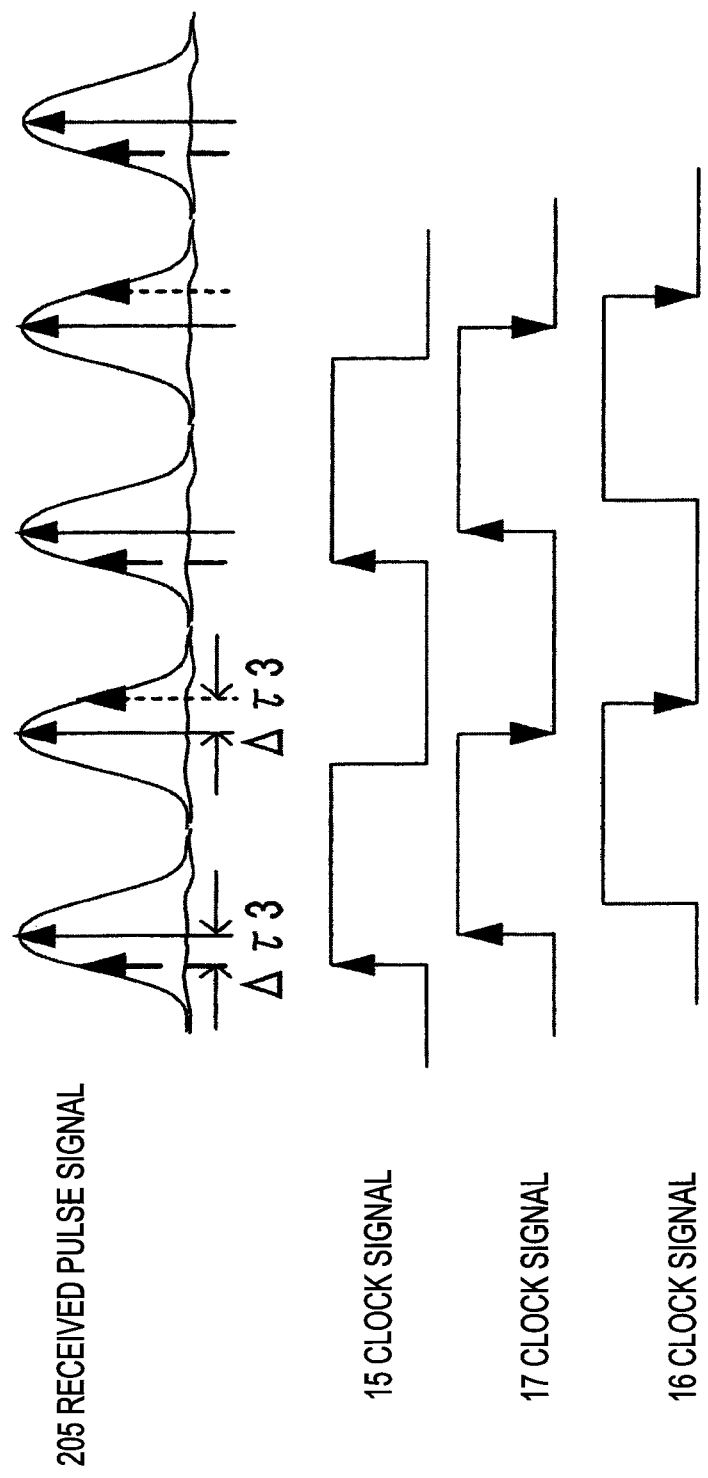
FIG. 7 is a timing chart showing a received pulse signal acquired at the time of synchronization achieved by the pulse-sync demodulator of the third embodiment.

Synchronization and demodulation operations performed by the pulse-sync demodulator of the present embodiment will now be described by reference to FIG. 7. FIG. 7 is a timing chart showing operation performed in the course of demodulation of a received pulse signal.

A received pulse signal 205 shown in FIG. 7 is a received signal input from the received signal input terminal 200. Sampling timings of the AD conversion sections 10 and 11 achieved in a state where synchronization is assured and achieved are indicated by arrows of broken lines, and sampling timings of the AD conversion section 12 are represented by arrows of solid lines.

The clock signal 15 is a signal input to the AD conversion section 10, and the AD conversion section 10 samples a received pulse signal at a leading edge of the clock signal 15. The clock signal 15 is a signal formed as a result of a clock signal, which is generated by the clock signal generation section 30 and has a frequency that is one-half of the transmission rate, being subjected to phase adjustment in the variable delay section 40 and the sampling timing adjustment section 20.

The clock signal 16 is a signal input to the AD conversion section 11, and the AD conversion section 11 samples a received pulse signal at a trailing edge of the clock signal 16. The clock signal 16 is a signal formed as a result of a clock signal, which is generated by the clock signal generation section 30 and has a frequency that is one-half of the transmission rate, being subjected to phase adjustment in the variable delay section 40 and the sampling timing adjustment section 21.

A clock signal 17 is a signal input to the AD conversion section 12, and the AD conversion section 12 samples a received pulse signal at both leading and trailing edges of the clock signal 17. The clock signal 17 is a signal formed as a result of a clock signal, which is generated by the clock signal generation section 30 and has a frequency that is one-half of the transmission rate, being subjected to phase adjustment in the variable delay section 40.

The sampling timing adjustment section 20 shifts the phase of a signal formed by subjecting a clock signal, which is generated by the clock signal generation section 30 and whose frequency is one-half of the transmission rate, to phase adjustment in the variable delay section 40, so as to become fast by a period of $\Delta\tau 3$.

The sampling timing adjustment section 21 additionally delays the phase of the clock signal output from the variable delay section 40 by a period of $\Delta\tau 3$. The period $\Delta\tau 3$ is assumed to be smaller than one-half of the symbol period and is set to a value that is smaller than one-half of a pulse width.

Since the sampling timing adjustment section 20 has a negative amount of delay, a normal delay device cannot be applied to the sampling timing adjustment section. However, the essential requirement for a relationship among the phases of the clock signals 15 to 17 is to be adjusted so as to assume a time interval of $\Delta\tau 3$ as shown in FIG. 7. Therefore, the adjustment can be implemented, so long as there is adopted a configuration including additionally interposing a sampling timing adjustment section 22 (indicated by a dotted line in FIG. 6) between the variable delay section 40 and the AD conversion section 12; taking the amounts of delay in all of the sampling timing adjustment sections as positive values; making the amount of delay in the sampling timing adjustment section 22 larger than the amount of delay in the sampling timing adjustment section 20 by $\Delta\tau 3$; and making the amount of delay in the sampling timing adjustment section 21 larger than the amount of delay in the sampling timing adjustment section 22 by $\Delta\tau 3$.

The AD conversion section 12 samples a received pulse signal at both edges of the clock signal 17 by means of a sampling frequency equivalent to a transmission rate, and the demodulation processing section 60 outputs a sampled value used for demodulation. An explanation is given to the embodiment in which only the AD conversion section 12 operates at a sampling frequency equivalent to the transmission rate, by reference to FIG. 6. However, the AD conversion section 12 may also be constituted by parallel connection of additional two AD conversion sections, and there may also be adopted a configuration in which all of the AD conversion sections are operated at a sampling frequency that is one-half of the transmission rate and in which the demodulation processing section 60 is caused to perform parallel-to-serial conversion processing, to thus acquire a demodulation data sequence.

In a state where synchronization is achieved, the amounts of delay in the variable delay sections are consecutively adjusted such that values sampled by the AD conversion sections 10 and 11 indicated by arrows of broken lines become equal to each other, as in the first embodiment. In the present embodiment, the waveform of a symbol pulse is essentially symmetrical; hence, the AD conversion section 12 samples a point optimum for demodulation simultaneously with achievement of synchronization, so that demodulation operation for the time of synchronization can be performed by means of subjecting the sampled value to threshold determination.

Figure 8:
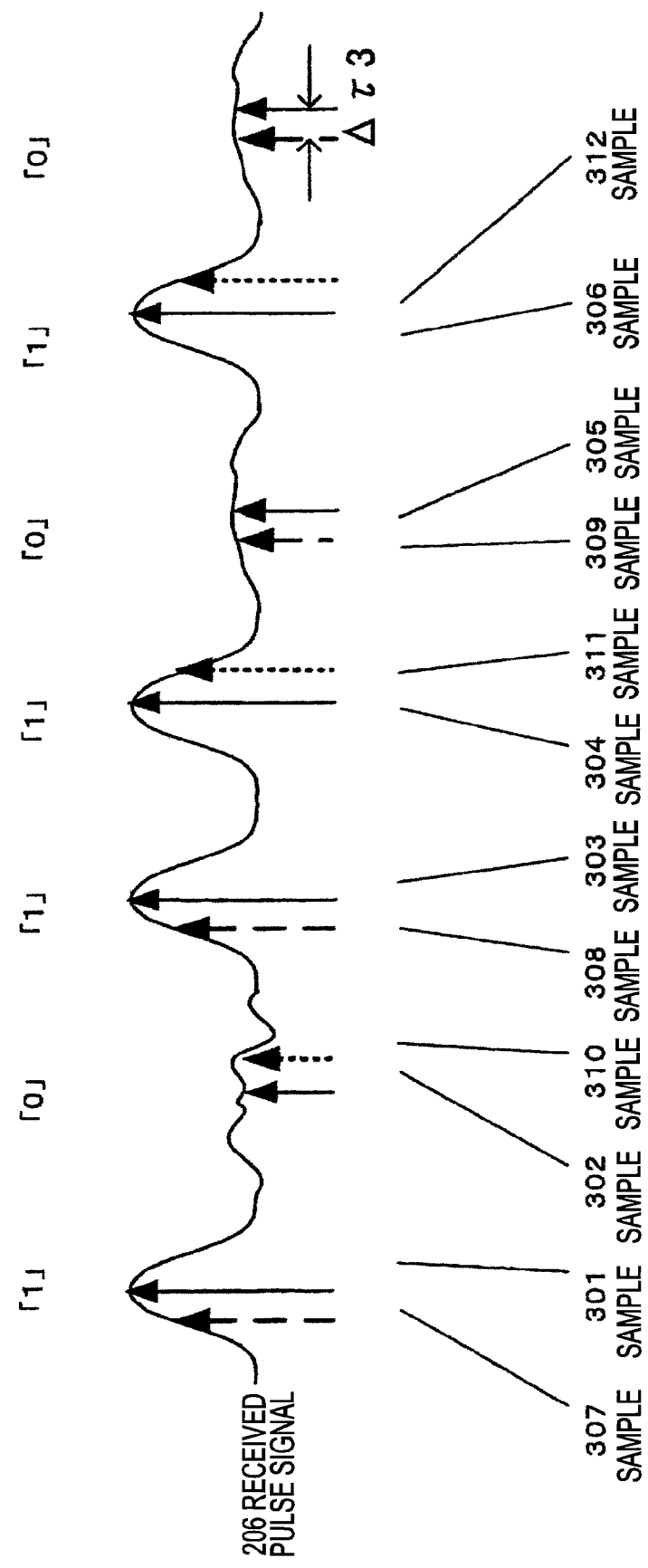
FIG. 8 is a timing chart showing a received pulse signal acquired at the time of demodulation performed by the pulse-sync demodulator of the third embodiment.

By reference to FIG. 8, a method for controlling the demodulation processing section 60 to the phase determination section 50 in the pulse-sync demodulator of the third embodiment and effects of the method will now be described. FIG. 8 is a timing chart showing operation performed in the course of synchronization and demodulation of the received pulse signal.

The received pulse signal 206 shows an example in which received data on-off keying modulated include symbols "1" and "0."

Samples 301 to 312 show sampling timings of the AD conversion sections; samples 301 to 306 show sampling timings of the AD conversion section 12; samples 307 to 309 show sampling timings of the AD conversion section 10; and samples 310 to 312 show a sampling timing of the AD conversion section 11. As in FIG. 7, arrows of broken lines show a sampling timing for synchronization to be performed by the AD conversion sections 10 and 11, and arrows of solid lines show a sampling timing for demodulation to be performed by the AD conversion section 12.

Although a pulse waveform of a symbol "0" is sampled and demodulated in the same manner as the sample 305, a value of the sample 309 for synchronization determination obtained by sampling the same symbol pulse inevitably becomes small since an amplitude level of a "0" symbol pulse is low.

In such a case, it is conceivable that, when the phase determination section 50 makes a determination, a value of the sample 309 and a value of the sample 312 will be compared with each other in spite of a state where synchronization is actually achieved and that the amount of delay in the variable delay section 40 will be changed unnecessarily because the values are not equal. As mentioned above, when demodulation and synchronization are simultaneously performed, an error in synchronization control effected by means of a sampled value of a symbol pulse "0" may raise a problem.

In the present embodiment, in order to prevent such an error in control, operation of the phase determination section 50 for changing the amount of delay in the variable delay section 40 is controlled by means of a result of demodulation performed by the demodulation processing section 60. For instance, when the demodulation processing section 60 demodulates the symbol "0" by means of the sample 305, the phase determination section 50 is made inoperative so as not to perform determination and comparison of the value of the sample 309 with the sample 312, both of which are obtained by sampling the same sample pulse under the control method, thereby preventing occurrence of a change in the amount of delay in the variable delay section 40.

When the samples 303 and 304 to be demodulated become a result of demodulation of the symbol "1," the phase determination section 50 is made operative, so as to perform phase adjustment of the variable delay section 40 on the basis of a result of determination and comparison of the samples 308 and 311.

In the present embodiment, there is a case where synchronization adjustment is not performed unless adjacent symbols come into a succession of "1." For instance, it also becomes possible to perform operation for holding a sampled value of the sample 307 for synchronization to be performed by the AD conversion section 10 when the sample 301 demodulates symbol "1" and comparing the sampled value with a value of the sample 311, which will appear later and is acquired by the AD conversion section 11, thereby controlling the variable delay section 40, and operation for averaging the samples 307 and 308 for synchronization responsive to a symbol pulse, by means of which "1" is demodulated, and comparing the average with a result of averaging of the samples 311 and 312 for synchronization, to thus control the variable delay section 40. A time interval between two samples used for comparative determination and the number of averages affect a pull-in speed of synchronization and a jitter characteristics. The only requirement is to select optimum operation in accordance with required specifications.

As mentioned above, according to the third embodiment, it is possible to construct a pulse-sync demodulator capable of simultaneously performing synchronization and demodulation, in connection with wireless transmission utilizing on-off keying modulation, by means of a combination of synchronization processing performed by the AD conversion sections 10, 11 that operate at a clock frequency which is one-half of the transmission rate with demodulation processing performed by the AD conversion section 12 that operates at a clock frequency of the transmission rate; and it is possible to achieve synchronization at the time of demodulation in addition to yielding the advantage of the first embodiment. Therefore, when compared with the case where synchronization and demodulation are alternately performed, padding of a data pattern for synchronization purpose can be reduced, thereby making it possible to enhance a throughput.

According to the third embodiment, in wireless transmission utilizing on-off keying modulation, even when the symbol pulses "1" and "0" are mixedly present, achievement of synchronization can be performed by preventing an error in synchronization control, whereby an attempt can be made to enhance synchronization performance, such as a jitter characteristic.

(Fourth Embodiment)

Figure 9:
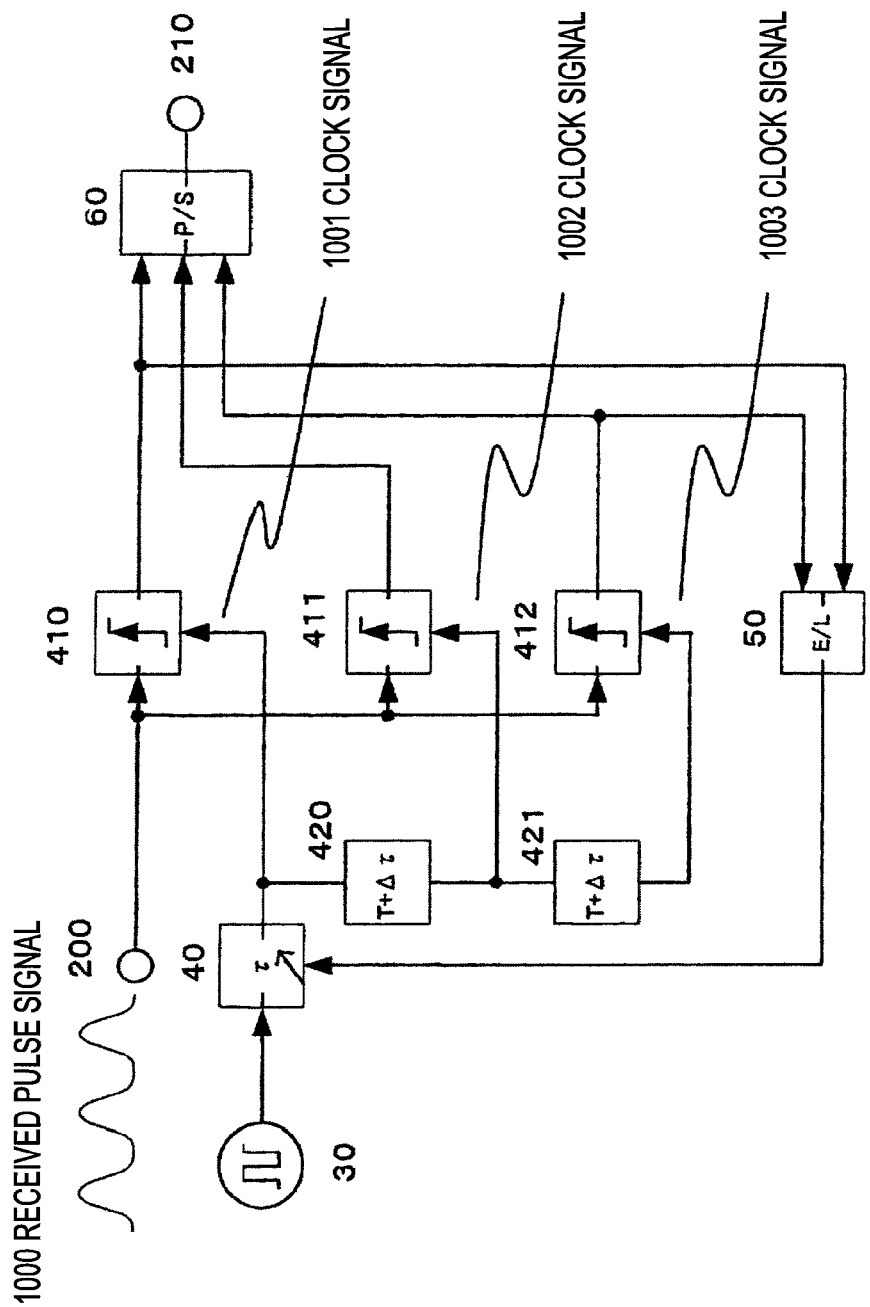
FIG. 9 is a block diagram showing an example configuration of a pulse-sync demodulator of a fourth embodiment.

FIG. 9 is a block diagram showing the configuration of a pulse-sync demodulator of a fourth embodiment (n=3) of the present invention. As shown in FIG. 9, the pulse-sync demodulator of the fourth embodiment has the received signal input terminal 200, AD conversion sections 410 to 412, sampling timing adjustment sections 420 and 421, the clock signal generation section 30, the variable delay section 40, the phase determination section 50, the demodulation processing section 60, and the demodulation output terminal 210.

Figure 10:
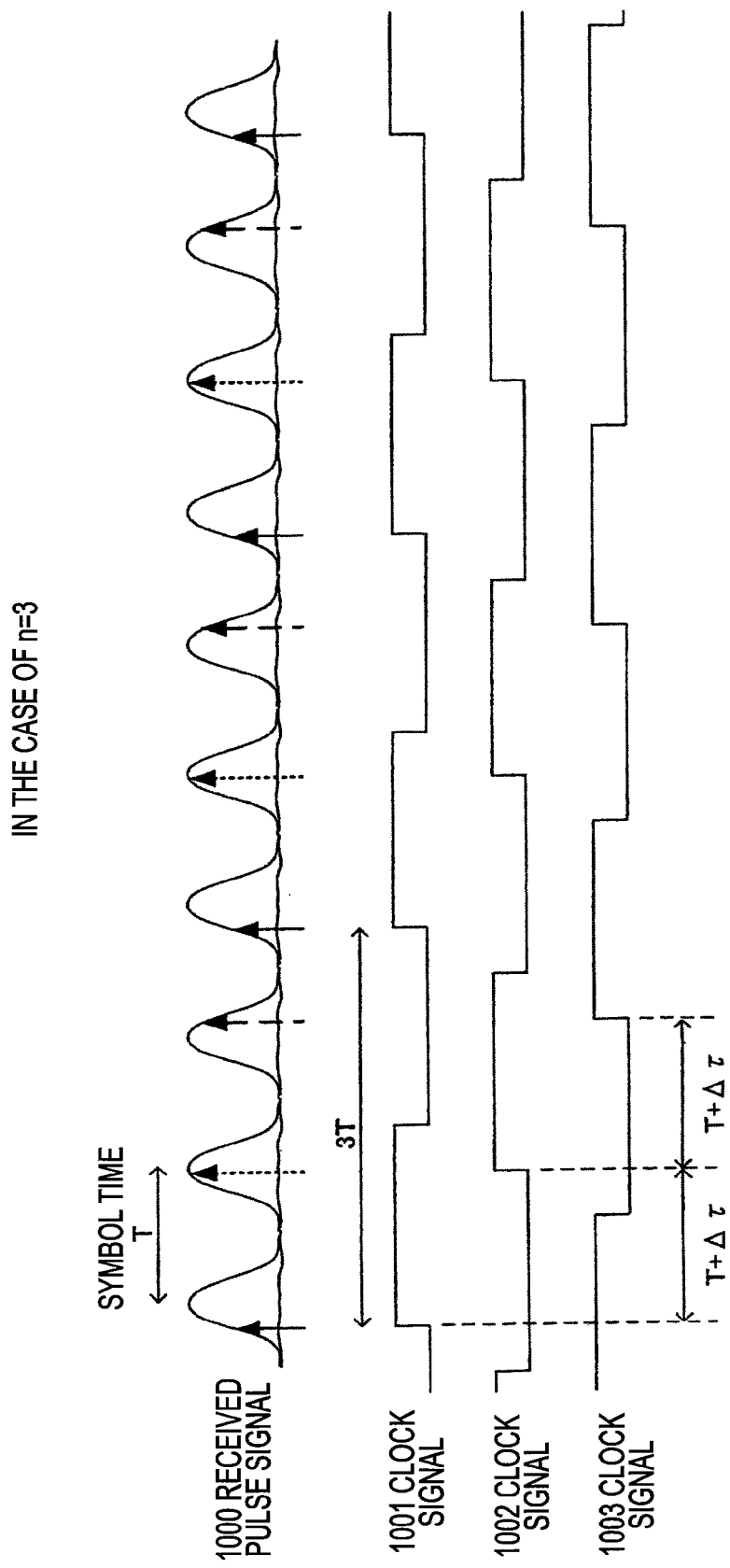
FIG. 10 is a timing chart showing a received pulse signal acquired at the time of synchronous pull-in operation performed by the pulse-sync demodulator of the fourth embodiment.
Figure 11:
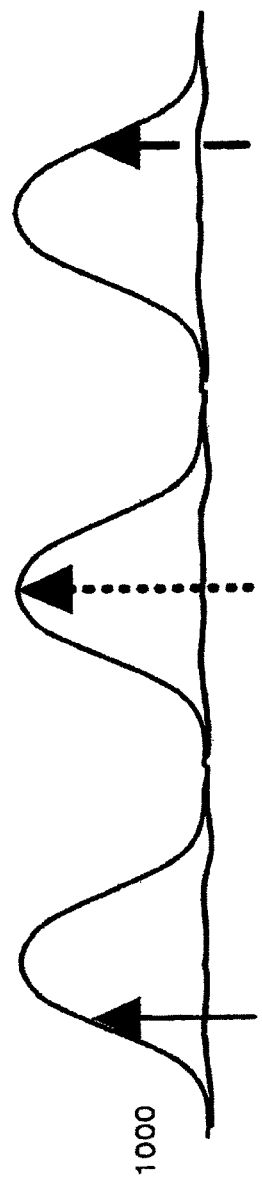
FIG. 11 is a timing chart showing a received pulse signal acquired at the time of synchronization achieved by the pulse-sync demodulator of the fourth embodiment.

A specific example synchronization method for the pulse-sync demodulator of the fourth embodiment will now be described by reference to FIGS. 10 and 11. FIG. 10 is a timing chart showing operation performed in the course of synchronization of a received pulse signal. FIG. 11 is a timing chart showing operation performed at the time of achievement of synchronization with a received pulse signal.

A received pulse signal 1000 is simultaneously input to the AD conversion sections 410 to 412. A symbol pulse of the received pulse signal is present in the symbol time T as illustrated, and a symbol interval is also taken as a time T. A clock signal 1001 shows a clock signal input to the AD conversion section 410; a clock signal 1002 shows a clock signal input to the AD conversion section 411; and a clock signal 1003 shows a clock signal input to the AD conversion section 412. The frequency of the clock signals is one-third of the transmission rate, and a period of the signals is three times as large as the symbol time T.

At the time of synchronization, operation is performed while the timing of the clock signals is shifted by an amount of phase shift Δτ. Since the present embodiment is the case of n=3, there stands a relationship of a symbol time T>Δτ+Δτ; namely, one-half of the symbol time T>an amount of phase shift Δτ, and the amount of phase shift Δτ approximately comes to 10 to 40% of the symbol time T. A numeral of the amount of phase shift Δτ varies according to required specifications. When early convergence of synchronization operation is desired, the interval is made wide. When an improvement in a jitter characteristic achieved at the time of achievement of synchronization is desired, the interval is set narrowly.

FIG. 11 shows operation performed at the time of achievement of synchronization to the received pulse signal and demodulation of the received pulse signal, and a received pulse signal 1000 is illustrated. The received pulse signal 100 shown in FIG. 11 is provided with sampling timings of the AD conversion sections 410 to 412 that are attained in a state of achievement of synchronization and that are designated by arrows of solid and broken lines.

In the state where synchronization is achieved, the phase determination section 40 controls the amount of delay in the variable delay section 40 such that a sampled value of the AD conversion section 410 and a sampled value of the AD conversion section 412 (a value sampled by the clock signal 1001 and a value sampled by the clock signal 1003) become equal to each other. A state where the sampled value of the AD conversion section 410 and the sampled value of the AD conversion section 412 become equal to each other as a result of changing of the amount of delay τ is taken as a synchronized state. Processing then proceeds to demodulation operation, so long as the synchronized state is assured for a given period of time.

As mentioned above, according to the fourth embodiment, in connection with wireless transmission utilizing on-off keying modulation, the pulse-sync demodulator capable of performing both synchronization and demodulation can be constructed by means of the AD conversion sections 410 to 412 that operate at a clock frequency which is one-third of the transmission rate. Synchronization and demodulation operations can be performed at power consumption that is smaller than that required in the related art.

According to the present embodiment, a pulse-sync demodulator that is made smaller than its counterpart of the related art in terms of a circuit scale can be provided by means of the configuration in which the AD conversion sections 410 to 412 are shared between the synchronization circuit and the demodulation circuit. Moreover, according to the present embodiment, all of the constituent elements that are required for synchronization and demodulation operations are easy to integrate, and advantages, such as cost reduction, resulting from integration can be yielded.

(Fifth Embodiment)

Figure 12:
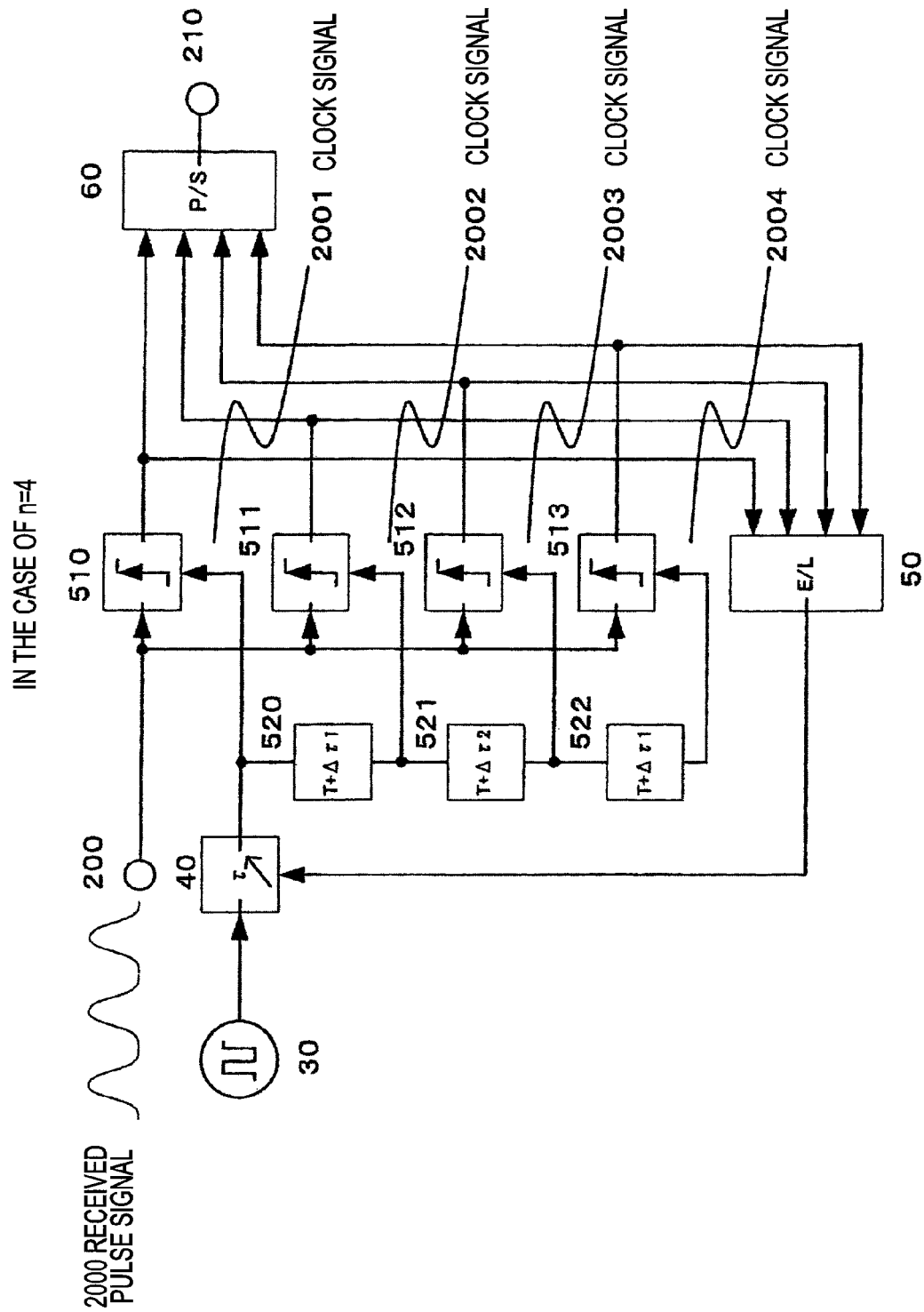
FIG. 12 is a block diagram showing an example configuration of a pulse-sync demodulator of a fifth embodiment.

FIG. 12 is a block diagram showing the configuration of a pulse-sync demodulator of a fifth embodiment (n=4) of the present invention. As shown in FIG. 12, the pulse-sync demodulator of the fifth embodiment has the received signal input terminal 200, AD conversion sections 510 to 513, sampling timing adjustment sections 520 to 522, the clock signal generation section 30, the variable delay section 40, the phase determination section 50, the demodulation processing section 60, and the demodulation output terminal 210.

Figure 13:
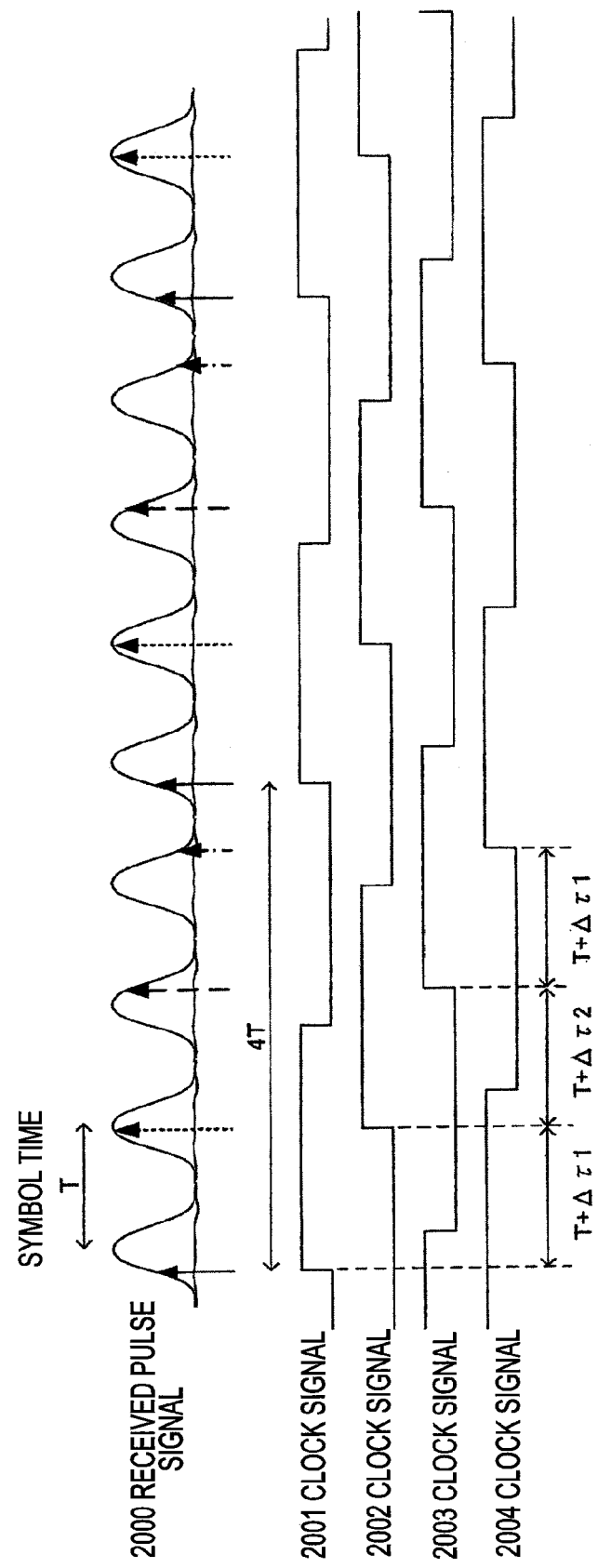
FIG. 13 is a timing chart showing a received pulse signal acquired at the time of synchronous pull-in operation performed by the pulse-sync demodulator of the fifth embodiment.
Figure 15:
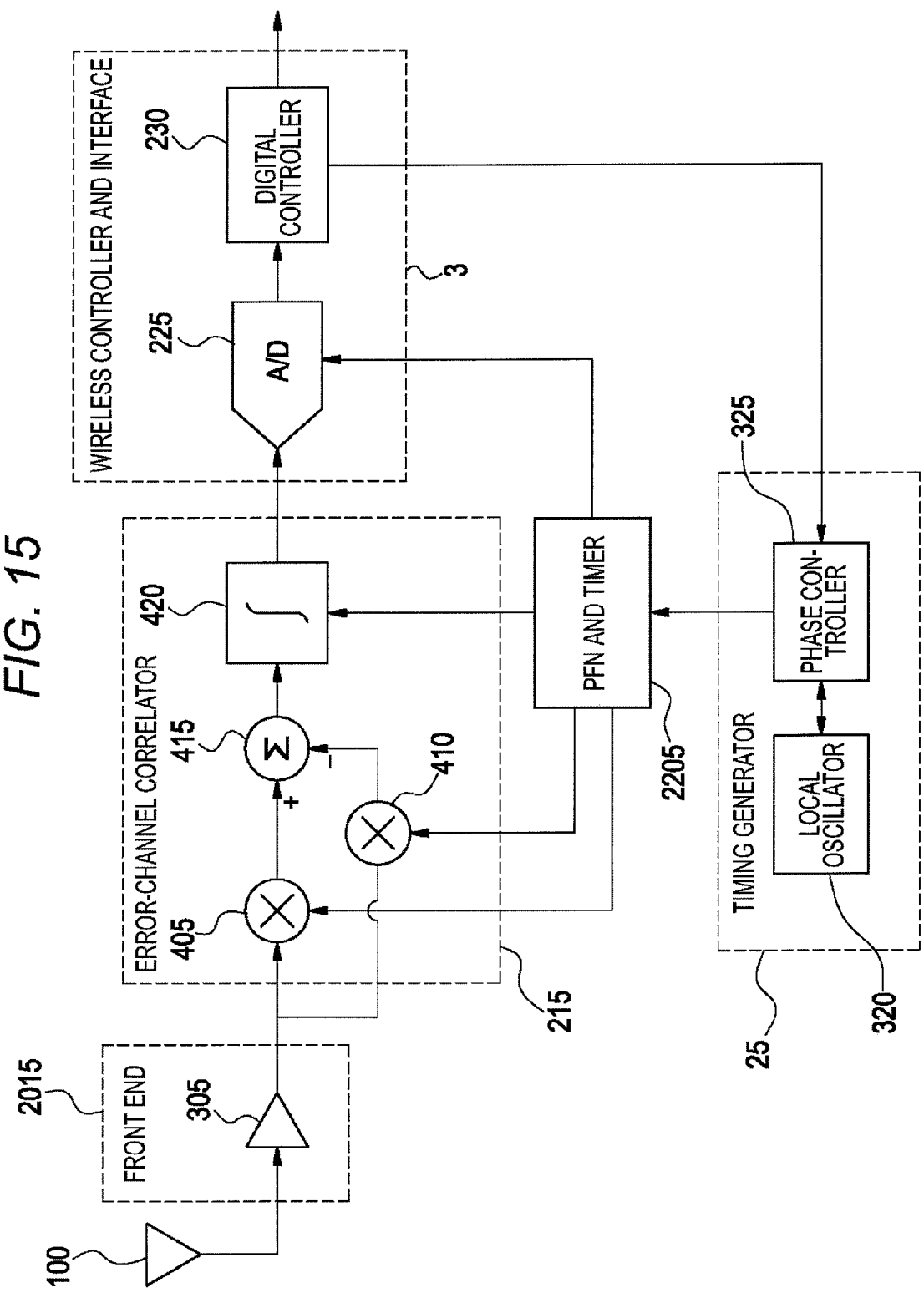
FIG. 15 is a block diagram showing a configuration for synchronization with a received pulse signal in the related art.
Figure 16:
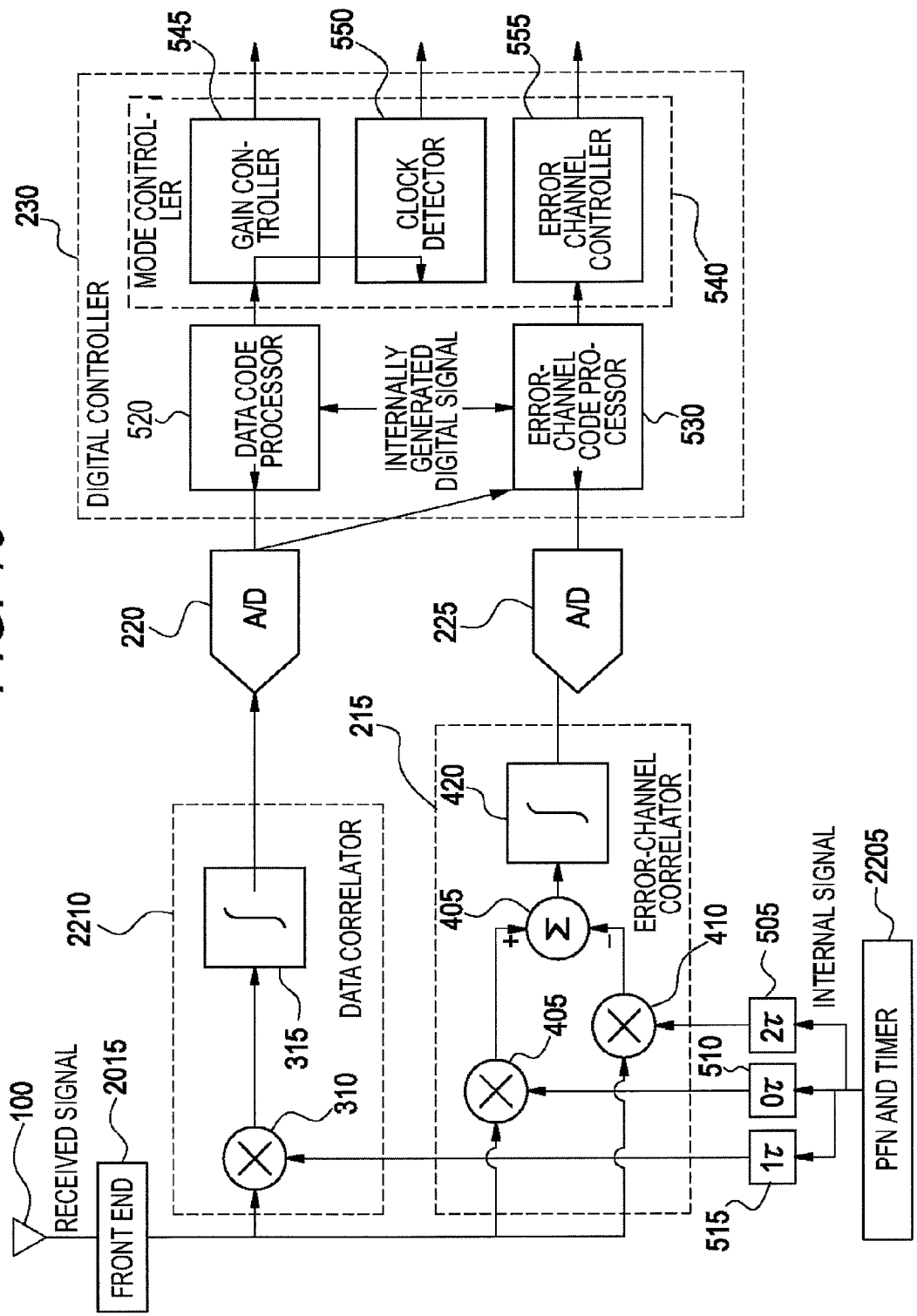
FIG. 16 is a block diagram showing a configuration for synchronization with and demodulation of a received pulse signal in the related art.
Figure 17A:
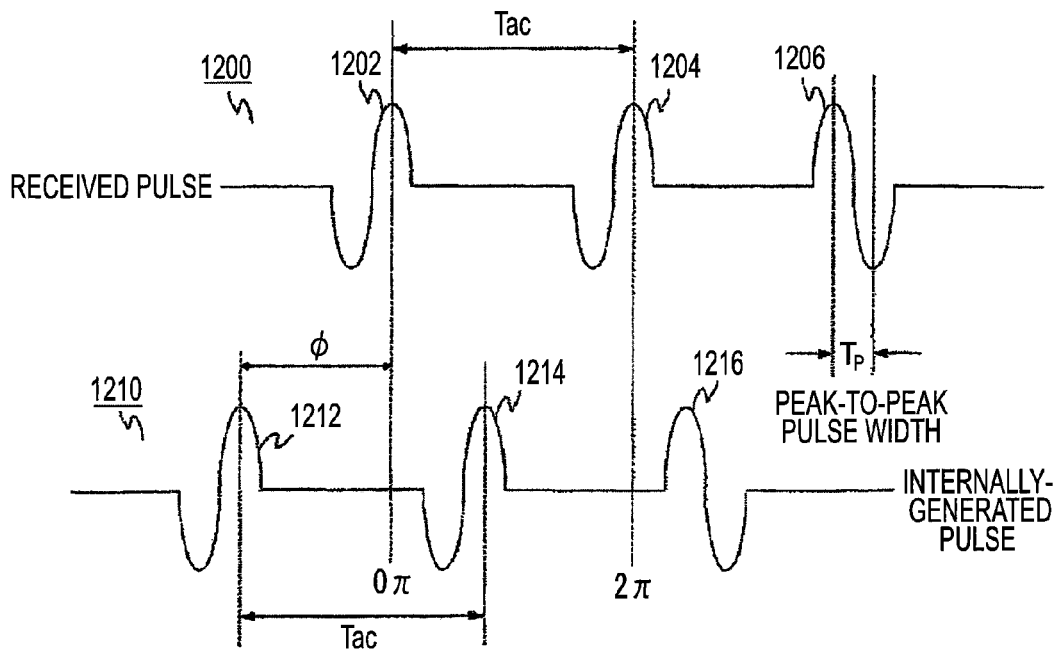
FIG. 17A is a view showing a timing relationship, in the related art, between a received pulse signal and an internally-generated pulse that is to become a replica.
Figure 17B:
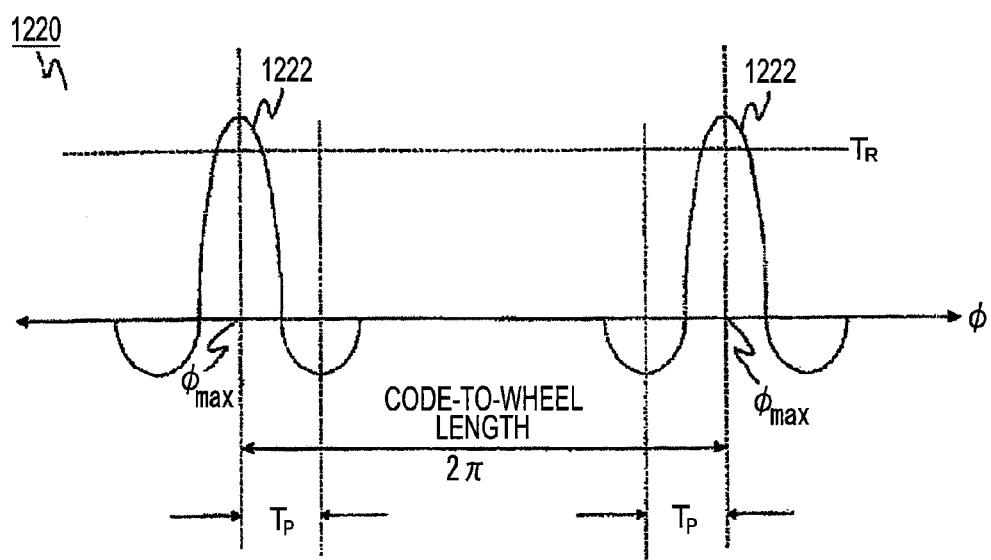
FIG. 17B is a view showing a relationship, in the related art, between a received pulse signal and an internally-generated pulse that is to become a replica in terms of a phase difference and a correlation output.
Figure 18A:
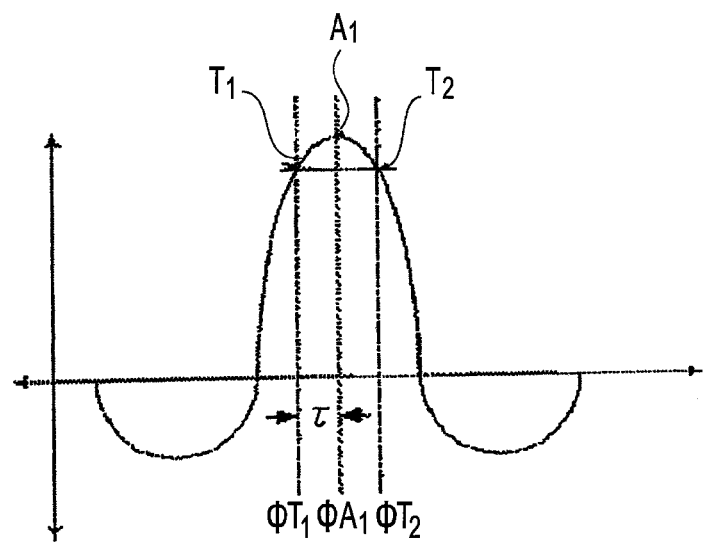
FIG. 18A is a view showing a relationship, achieved when synchronization is achieved in the related art, between a received pulse signal and an internally-generated pulse that is to become a replica in terms of a phase difference and a correlation output.
Figure 18B:
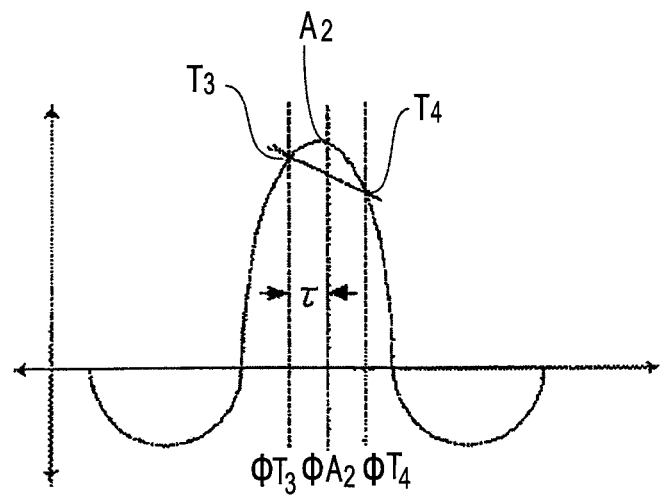
FIG. 18B is a view showing a relationship, achieved when synchronization is achieved in the related art, between a received pulse signal and an internally-generated pulse that is to become a replica in terms of a phase difference and a correlation output.
Figure 18C:
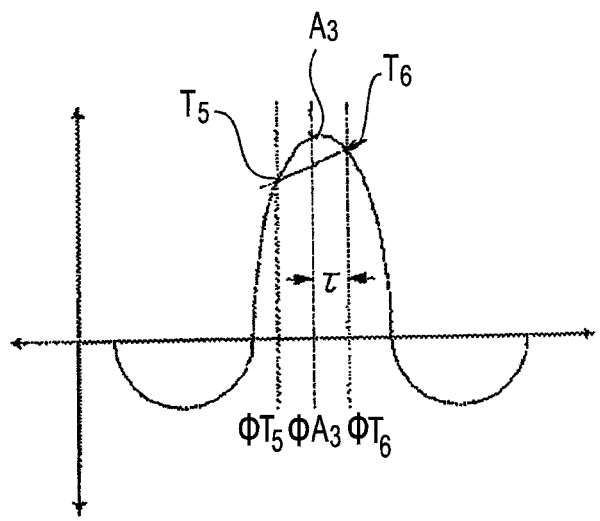
FIG. 18C is a view showing a relationship, achieved when synchronization is achieved in the related art, between a received pulse signal and an internally-generated pulse that is to become a replica in terms of a phase difference and a correlation output.

By reference to FIGS. 13 and 14, a specific example synchronization method for the pulse-sync demodulator of the fifth embodiment will be described. FIG. 13 is a timing chart showing operation performed in the course of synchronization with a received pulse signal, and FIG. 14 is a timing chart showing operation performed at the time of achievement of synchronization with the received pulse signal.

A received pulse signal 2000 is simultaneously input to the AD conversion sections 510 to 513. A symbol pulse of the received pulse signal is present in the symbol time T as illustrated, and a symbol interval is also taken as a time T. A clock signal 2001 shows a clock signal input to the AD conversion section 510; and a clock signal 2002 shows a clock signal input to the AD conversion section 511.

A clock signal 2003 shows a clock signal input to the AD conversion section 512, and a clock signal 2004 shows a clock signal input to the AD conversion section 513. The frequency of the clock signals is one-fourths of the transmission rate, and the period of the clock signals is four times as large as the symbol time T.

During synchronization, operation is performed while timing of the clock signal is shifted by the amount of phase shift $\Delta\tau$. Since the present embodiment is directed for the case of n=4, there stands a relationship of the symbol time $T > \Delta\tau 1 + \Delta\tau 2 + \Delta\tau 1$. In the present embodiment, the amount of phase shift may also be made at regular intervals, such as $\Delta\tau 1 = \Delta\tau 2$. In this case, there stands a relationship of $T/3 > \Delta\tau 1 = \Delta\tau 2$. A numeral of the amount of phase shift $\Delta\tau$ varies according to required specifications. When early convergence of synchronization operation is desired, the interval is made wide. When an improvement in a jitter characteristic achieved at the time of achievement of synchronization is desired, the interval is set narrowly.

FIG. 14 shows operation performed at the time of achievement of synchronization with and demodulation of the received pulse signal, and the received pulse signal 2000 is illustrated. The received pulse signal 2000 shown in FIG. 14 is provided with sampling timings of the AD conversion sections 510 to 513 achieved in a state where synchronization is achieved, in the form of arrows of solid lines and arrows of broken lines.

Since a waveform of the received pulse signal 2000 can be assumed to be symmetrical in the state where synchronization is achieved, the phase determination section 40 controls the amount of delay in the variable delay section 40 in such a way that sampled values of the AD conversion sections 510 and 513 (a value sampled by the clock signal 1001 and a value sampled by the clock signal 1004) become equal to sampled values of the AD conversion sections 511 and 512 (a value sampled by the clock signal 1002 and a value sampled by the clock signal 1003).

A state where the sampled values of the AD conversion sections 510 and 513 become equal to the sampled values of the AD conversion sections 511 and 512 by changing the amount of delay $\tau$ is taken as a synchronous state, and processing proceeds to demodulation operation after the synchronous state has been assured for a given period of time.

As mentioned above, according to the fifth embodiment, in connection with wireless transmission utilizing on-off keying modulation, the pulse-sync demodulator capable of performing both synchronization and demodulation can be constructed by means of the AD conversion sections 510 to 513 that operate at a clock frequency which is one-fourths of the transmission rate. Synchronization and demodulation operations can be performed at power consumption that is smaller than that required in the related art.

According to the present embodiment, a pulse-sync demodulator that is made smaller than its counterpart of the related art in terms of a circuit scale can be provided by means of the configuration in which the AD conversion sections 510 to 513 are shared between the synchronization circuit and the demodulation circuit. Moreover, according to the present embodiment, all of the constituent elements that are required for synchronization and demodulation operations are easy to integrate, and advantages, such as cost reduction, resulting from integration can be yielded.

(Sixth Embodiment)

Figure 19:
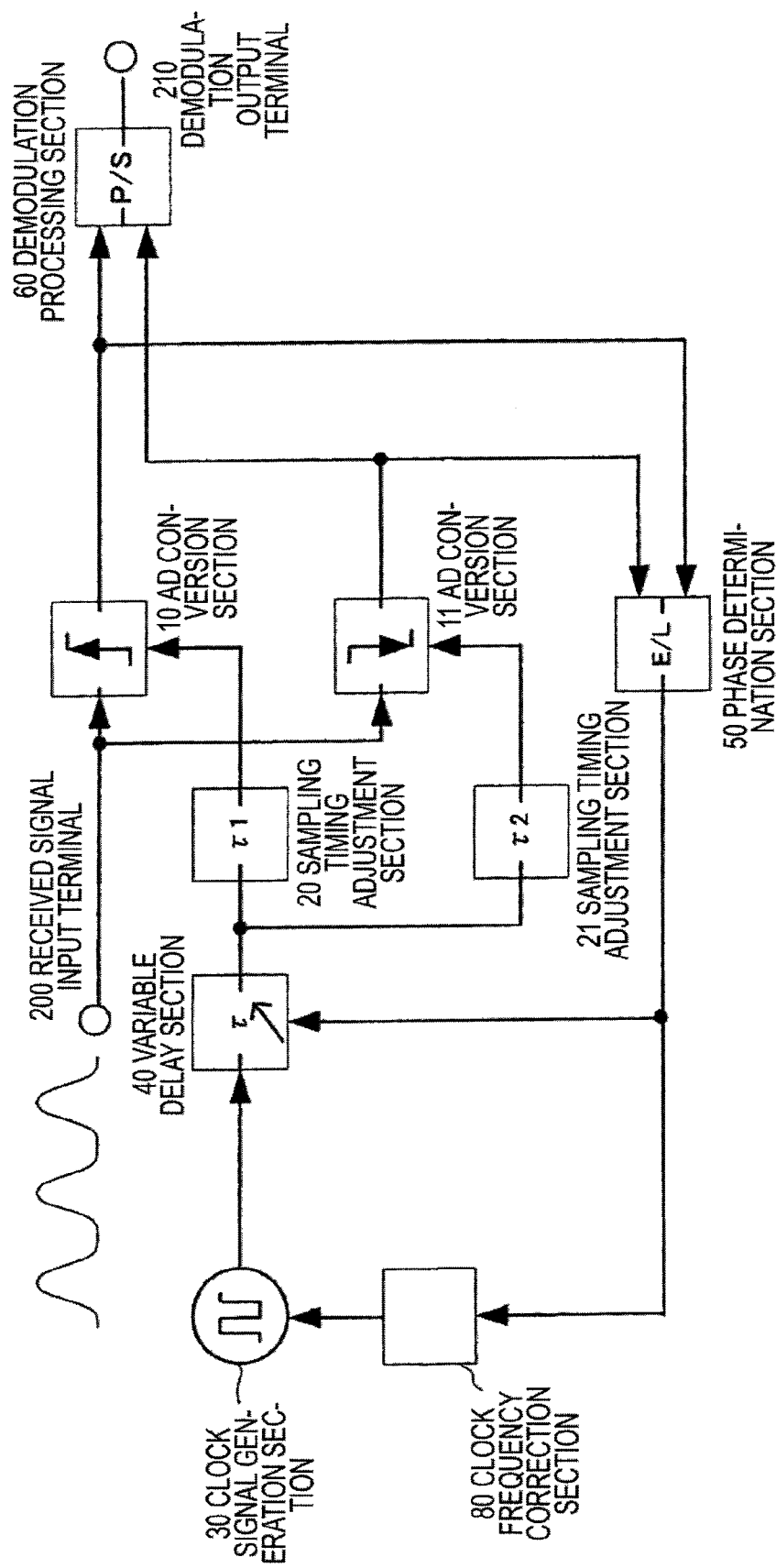
FIG. 19 is a block diagram showing an example configuration of a pulse-sync demodulator of a sixth embodiment.

FIG. 19 is a block diagram showing the configuration of a pulse-sync demodulator of a sixth embodiment of the present invention. As shown in FIG. 19, in addition to having the received signal input terminal 200, AD conversion sections 10 to 11, sampling timing adjustment sections 20 to 21, the clock signal generation section 30, the variable delay section 40, the phase determination section 50, the demodulation processing section 60, and the demodulation output terminal 210, all of which are analogous to those shown in FIG. 1, the pulse-sync demodulator of the sixth embodiment has a clock frequency correction section 80.

The clock frequency correction section 80 finely adjusts the frequency of the clock signal generated by the clock signal generation section 30. For instance, when a frequency difference exists between the reference oscillation source at the transmission end the reference oscillation source at the receiving end, the clock frequency correction section plays the role of correcting the frequency difference at the receiving end. At the time of acquisition of synchronization, the clock frequency correction section 80 receives the amount of adjustment of a delay level output from the phase determination section 50 to the variable delay section 40; extracts a first-order coefficient of a time change in the amount of adjustment; determines the coefficient, namely, the amount of adjustment of the frequency performed by the clock signal generation section 30 from a linear gradient of the time change; and adjusts the clock frequency of the clock signal generation section 30.

A specific example of the method for adjusting the frequency of a clock signal in the pulse-sync demodulator of the sixth embodiment will now be described by reference to FIG. 20. The device at the transmission end generates a transmission pulse signal 3000 from a clock signal 3001; subjects the pulse signal to RF modulation; and transmits the thus-modulated signal. The drawing shows an example in which a transmission pulse signal is generated at the transmission end by means of a clock whose frequency is one-half of the symbol rate. The device at the receiving end receives a receive pulse signal 3010 having the same symbol rate as that of the transmission pulse signal. Provided that the frequency of the clock signal of the device at the receiving end is completely identical with the frequency of the clock signal 3001 of the device at the transmission end, optimum sampling points of respective symbols can be continuously captured as illustrated by arrows provided in the transmission pulse signal 3000 at the time of achievement of synchronization. However, for instance, when the frequency of a clock signal 3011 of a device at the receiving end is lower than the frequency of the clock signal 3001 of the device at the transmission end and when the clock signal 3011 is longer than the clock signal 3001 in terms of a period as illustrated, a sampling point optimum for the next symbol cannot be captured even after synchronization is achieved at the first symbol, so that sampling is performed at delayed timings.

Figure 20:
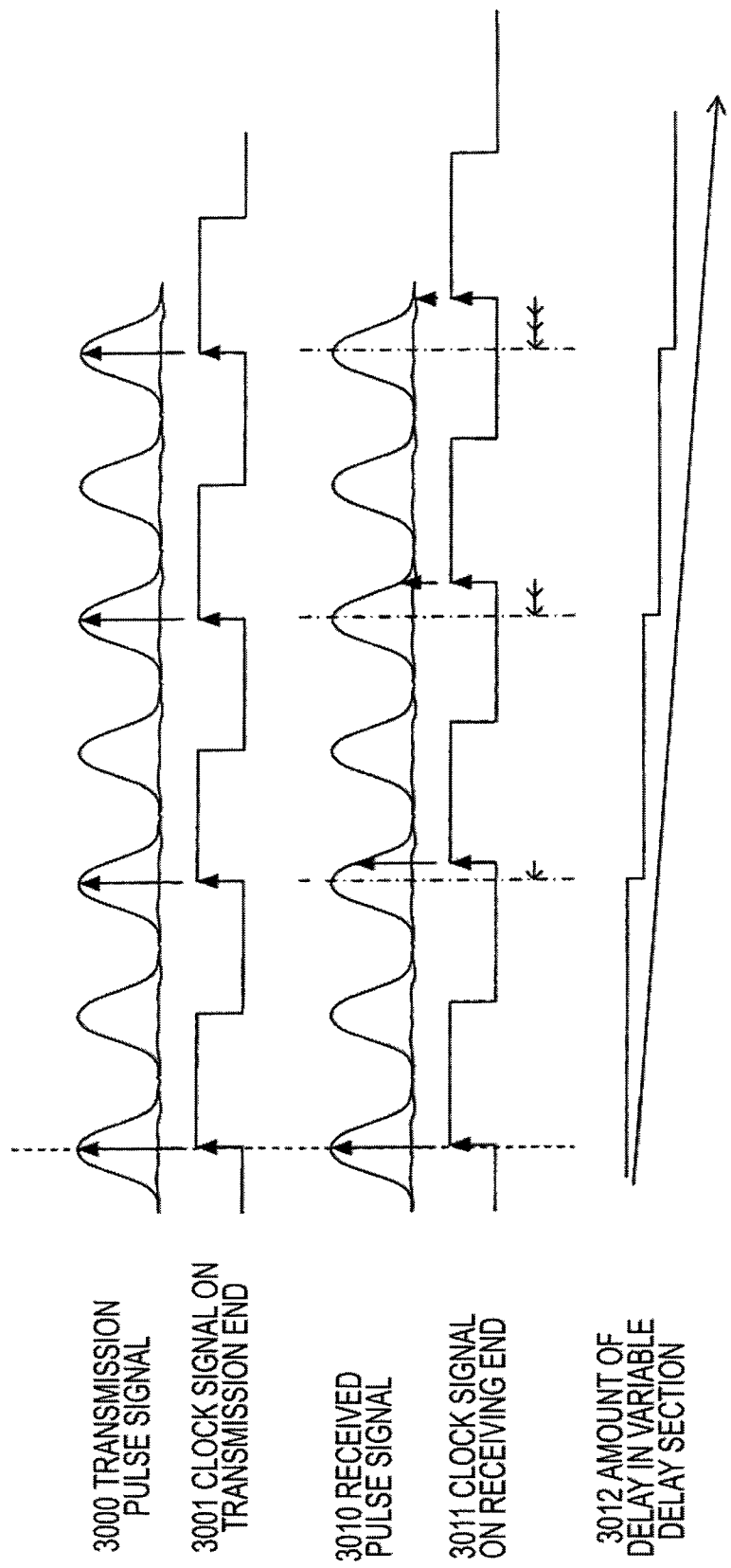
FIG. 20 is a timing chart for describing a specific example of a method for adjusting the frequency of a clock signal in the pulse-sync demodulator of the sixth embodiment.

In the pulse-sync demodulator of the preceding embodiment, time lags in the sampling timings as provided in the receive pulse signal 3010 shown in FIG. 20, which are attributable to an error in the clock frequency between the transmission end and the receiving end, are corrected by the amount of delay in the variable delay section 40 acquired at the time of achievement of synchronization. Specifically, in the case of the embodiment shown in FIG. 20, the time lags in the sampling timings are corrected, as indicated by the variable-delay-section delay level 3012, by means of operation for decreasing the amount of delay by a given amount at each symbol, and operation is performed such that the sampling timing of the clock signal 3011 acquired at the receiving end becomes equal to the timing illustrated in connection with the pulse signal 3000.

In contrast, in the present embodiment, when a variable-delay-section delay level 3012 acquired at the time of achievement of synchronization changes at a given gradient, the change is detected, and the clock frequency correction section 80 is caused to operate so as to adjust the clock signal frequency of the clock signal generation section 30 in accordance with the gradient. For instance, when the variabledelay-section delay level 3012 changes at a negative first-order gradient as shown in FIG. 20, the clock frequency correction section 80 performs adjustment so as to increase the frequency of the clock signal generation section 30. When the variable-delay-section delay level 3012 has a positive first-order gradient, the clock frequency correction section 80 performs adjustment so as to decrease the frequency of the clock signal generation section 30. When the gradient is large, the clock frequency correction section 80 increases the amount of frequency adjustment. Consequently, the clock signal 3011 acquired at the receiving end shown in FIG. 20 is adjusted in such a way that the frequency of the signal increases, to thus become equal to the frequency of the clock signal 3001 acquired at the transmission end. As a consequence, an effect of automatic frequency control (AFC) is produced.

As mentioned above, according to the sixth embodiment, when a frequency difference exists between the reference oscillation source at the transmission end the reference oscillation source at the receiving end, control is performed so as to finely adjust the frequency of the clock signal generation section 30 in accordance with the amount of control of a delay in the variable delay section 40, whereby synchronization with the frequency of the signal acquired at the transmission end is achieved. Hence, a change in the amount of delay in the variable delay section 40 acquired at the time of achievement of synchronization can be reduced. There can be performed high-accuracy demodulation with a reduction in the time lags of the optimum sampling points which arise at the time of demodulation as a result of elapse of a time. After fine adjustment has been performed by extraction of an error in frequency, the frequency of control of delay adjustment of the clock signal performed at the time of achievement of synchronization can be reduced, which is also effective for power saving.

According to the above-described respective embodiments, in connection with wireless transmission utilizing on-off keying modulation effective for implementing high-speed pulse transmission at low cost by means of a particularly-simple circuit, there can be provided a pulse-sync demodulator capable of performing synchronization and demodulation operations at power consumption, which is lower than that achieved in the related art, by means of a configuration using the AD conversion sections that operate at a clock frequency lower than the transmission rate by one-half or more.

According to the present embodiment, there can be provided the pulse-sync demodulator that is made smaller than its related-art counterpart in terms of a circuit scale by means of the configuration in which the AD conversion sections are shared between the synchronization circuit and the demodulation circuit. Moreover, according to the present embodiment, all of the constituent elements that are required for synchronization and demodulation operations are easy to integrate, and advantages, such as cost reduction, resulting from integration can be yielded.

According to the present embodiment, the operating clock frequency of the constituent elements can be reduced to one-half or less of the transmission rate; hence, constraints on designing are lessened, and a device which is easy to implement and which is inexpensive in terms of design cost can be provided.

In the descriptions of the embodiments, wireless transmission based on the on-off keying modulation scheme is illustrated as an example. However, amplitude shift-keying (ASK) modulation is a modulation scheme of the same type, and similar advantages are yielded. Further, the present invention is useful not only for the device pertaining to wireless transmission but also in pulse transmission used in the field of optical communication as a device for performing synchronous demodulation at the receiving end.

Although the present invention has been described in detail by reference to the specific embodiments, it is manifest to those skilled in the art that the present invention is susceptible to various alterations or modifications without departing the scope and spirit of the present invention.

The present patent application is based on Japanese Patent Application (JP-A-2006-205051) filed on Jul. 27, 2006, and Japanese Patent Application (JP-A-2007-194449) filed on Jul. 26, 2007, contents of which are incorporated herein for reference.

Industrial Applicability

A pulse-sync demodulator of the present invention yields an advantage of synchronization and demodulation of a pulse signal being enabled in high-speed wireless pulse communication by means of a low-power consumption, small-scale configuration that is easy to implement; and is particularly useful for a device that performs high-speed wireless data transmission as in a UWB.

The invention claimed is:

1. A pulse-sync demodulator that receives a pulse signal of a first frequency, comprising:
   a clock signal generation section that generates a clock signal of a second frequency which is one-half of the first frequency;
   a plurality of AD conversion sections that sample the pulse signal at different sampling timings of the clock signal;
   a phase determination section that generates a phase control signal in accordance with magnitudes of a plurality of sampled values output from the plurality of AD conversion sections;
   a variable delay section that changes an amount of delay in the clock signal generated by the clock signal generation section in accordance with the phase control signal;
   a plurality of sampling timing adjustment sections that are provided in correspondence with the plurality of AD conversion sections, respectively, and that can individually adjust the amount of delay in the clock signal output from the variable delay section; and
   a level determination section that detects levels of the plurality of sampled values output from the plurality of AD conversion sections and that increases or decreases the amount of delay in the variable delay section by a predetermined amount when the levels of the plurality of sampled values become lower than a preset value, wherein
   a difference ($\Delta\tau$) among amounts of delays in the plurality of sampling timing adjustment sections is set to values which are equal to or smaller than a half width of the amplitude of the pulse signal in a synchronization process;
   the amount of delay in the variable delay section is increased or decreased for a period of time corresponding to one-half of a pulse width of the pulse signal when a plurality of sampled values output from the plurality of AD conversion sections come to values which are smaller than one-half of the amplitude of the pulse signal;
   the plurality of AD conversion sections comprise a first AD conversion section and a second AD conversion section;
   the first AD conversion section samples the pulse signal of the first frequency by means of a leading edge of the clock signal of the second frequency; and the second AD conversion section samples the pulse signal of the first frequency by means of a trailing edge of the clock signal of the second frequency shifted by the difference($\Delta\tau$) between an amount of delay in a first sampling timing adjustment section and an amount of delay in a second sampling timing adjustment section;

wherein the first sampling timing adjustment section adjusts the sampling timing of the clock signal input to the first AD conversion section and the second sampling timing adjustment section adjusts the sampling timing of the clock signal input to the second AD conversion section.

2. The pulse-sync demodulator according to claim 1, wherein, in a synchronization process for synchronizing the clock signal to the pulse signal, the level determination section changes the amount of delay in the variable delay section when the plurality of sampled values output from the plurality of AD conversion sections are different from each other, and holds the amount of delay in the variable delay section when the plurality of sampled values output from the plurality of AD conversion sections become equal to each other.

3. The pulse-sync demodulator according to claim 1, further comprising a demodulation processing section that demodulates the plurality of sampled values output from the plurality of AD conversion sections and outputs results of demodulation.

4. The pulse-sync demodulator according to claim 1 further comprising:
a demodulation AD conversion section that samples the pulse signal at predetermined sampling timing of the clock signal; and
a demodulation processing section the demodulates a plurality of sampled values output from the demodulation AD conversion sections and outputs results of demodulation.

5. The pulse-sync demodulator according to claim 4, wherein
the pulse signal is a pulse signal wirelessly transmitted by ASK modulation; and
the demodulation processing section determines presence or absence of a symbol pulse by using the sampled values output from the demodulation AD conversion section and performs control operation in such a manner that, when determining that the symbol pulse is absent, a sampled value of the synchronization AD conversion section corresponding to the symbol pulse is not used for phase determination performed by the phase determination section.

6. The pulse-sync demodulator according to claim 1, wherein the phase determination section controls the amount of delay in the variable delay section such that the plurality of sampled values output from the plurality of AD conversion sections become equal to each other.

7. The pulse-sync demodulator according to claim 1, wherein a difference ($\Delta\tau$) among the amounts of delay adjusted by the plurality of sampling timing adjustment sections is smaller than a pulse width of the pulse signal.

8. The pulse-sync demodulator according to claim 7, wherein the plurality of sampling timing adjustment sections cause the difference ($\Delta\tau$) in the amounts of delay in the synchronization process for synchronizing the clock signal to the pulse signal and sets the difference ($\Delta\tau$) in the amounts of delay to zero at the time of demodulation of the pulse signal.

9. The pulse-sync demodulator according to claim 1, further comprising a clock frequency correction section that detects a given amount of change from changes in the phase control signal generated by the phase determination section, thereby adjusting a frequency of the clock signal output from the clock signal generation section in accordance with an increment/decrement in the amount of change and a gradient of the same.

10. The pulse-sync demodulator according to claim 7, wherein the plurality of sampling timing adjustment sections generate the difference ($\Delta\tau$) in the amounts of delay in a former half of the synchronization process for synchronizing the clock signal to the pulse signal and reduces the difference ($\Delta\tau$) in the amounts of delay with progress in the synchronization process.

11. A pulse-sync demodulator that receives a pulse signal of a first frequency, comprising:
a clock signal generation section that generates a clock signal of a second frequency which is one-half of the first frequency;
a plurality of AD conversion sections that sample the pulse signal at different sampling timings of the clock signal;
a phase determination section that generates a phase control signal in accordance with magnitudes of a plurality of sampled values output from the plurality of AD conversion sections;
a variable delay section that changes an amount of delay in the clock signal generated by the clock signal generation section in accordance with the phase control signal;
a plurality of sampling timing adjustment sections that are provided in correspondence with the plurality of AD conversion sections, respectively, and that can individually adjust the amount of delay in the clock signal output from the variable delay section, wherein the second frequency is the one-$n^{th}$ ("n" is an integer of two or more) of the first frequency, and the "n" AD conversion sections are connected for the pulse signal in parallel and generates "n" sampled values; and
a level determination section that detects levels of the plurality of sampled values output from the plurality of AD conversion sections and that increases or decreases the amount of delay in the variable delay section by a predetermined amount when the levels of the plurality of sampled values become lower than a preset value, wherein
a difference ($\Delta\tau$) among amounts of delays in the plurality of sampling timing adjustment sections is set to values which are equal to or smaller than a half width of the amplitude of the pulse signal in a synchronization process;
the amount of delay in the variable delay section is increased or decreased for a period of time corresponding to one-half of a pulse width of the pulse signal when a plurality of sampled values output from the plurality of AD conversion sections come to values which are smaller than one-half of the amplitude of the pulse signal;
the plurality of AD conversion sections comprise a first AD conversion section and a second AD conversion section;
the first AD conversion section samples the pulse signal of the first frequency by means of a leading edge of the clock signal of the second frequency; and
the second AD conversion section samples the pulse signal of the first frequency by means of a trailing edge of the clock signal of the second frequency shifted by the difference ($\Delta\tau$) between an amount of delay in a first sampling timing adjustment section and an amount of delay in a second sampling timing adjustment section, wherein the first sampling timing adjustment section adjusts the sampling timing of the clock signal input to the first AD conversion section and the second sampling timing adjustment section adjusts the sampling timing of the clock signal input to the second AD conversion section.

12. The pulse-sync demodulator according to claim 11, wherein the plurality of AD conversion sections respectively sample "n" different symbols of the pulse signal.

* * * * *